(12) United States Patent
Tachioka et al.

(10) Patent No.: US 9,728,441 B2
(45) Date of Patent: Aug. 8, 2017

(54) METHOD FOR MANUFACTURING SEMICONDUCTOR DEVICE

(71) Applicant: FUJI ELECTRIC CO., LTD., Kawasaki (JP)

(72) Inventors: Masaaki Tachioka, Matsumoto (JP); Tsunehiro Nakajima, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 0 days.

(21) Appl. No.: 14/844,845

(22) Filed: Sep. 3, 2015

(65) Prior Publication Data
US 2015/0380292 A1 Dec. 31, 2015

Related U.S. Application Data

(63) Continuation of application No. PCT/JP2014/059989, filed on Apr. 4, 2014.

(30) Foreign Application Priority Data

Apr. 4, 2013 (JP) .................................. 2013-078570

(51) Int. Cl.
*H01L 21/268* (2006.01)
*H01L 21/683* (2006.01)
(Continued)

(52) U.S. Cl.
CPC ...... *H01L 21/6835* (2013.01); *B23K 26/0006* (2013.01); *B23K 26/0057* (2013.01);
(Continued)

(58) Field of Classification Search
CPC . H01L 21/268; H01L 21/683; H01L 21/6835; H01L 2221/68318;
(Continued)

(56) References Cited

U.S. PATENT DOCUMENTS 7,635,617 B2 * 12/2009 Yamazaki ........... H01L 21/2007
257/E21.561
2003/0047280 A1 3/2003 Takayama et al.
(Continued)

FOREIGN PATENT DOCUMENTS

CN 1409374 A 4/2003
JP 06-029385 2/1994
(Continued)

OTHER PUBLICATIONS

International Search Report mailed Jun. 24, 2014 in corresponding international application PCT/JP2014/059989.
(Continued)

*Primary Examiner* — Thanh T Nguyen

(57) ABSTRACT

A method for manufacturing a semiconductor device includes: bonding at least a part of the rear surface of a semiconductor wafer, and a supporting substrate in use of using a silane coupling agent; forming a functional structure on a front surface of the semiconductor wafer; placing a condensation point of laser light transmitted through the semiconductor wafer on a bonding interface between the semiconductor wafer and the supporting substrate, and irradiating the bonding interface with the laser light, thereby forming a fracture layer on at least a part of an outer circumferential section of the bonding interface; separating the bonding interface; and carrying out rear surface processing on the rear surface of the semiconductor wafer.

19 Claims, 12 Drawing Sheets

(51) Int. Cl.
*C09J 183/06* (2006.01)
*B23K 26/00* (2014.01)
*C09J 183/08* (2006.01)
*H01L 21/762* (2006.01)
*H01L 21/20* (2006.01)
*B23K 101/40* (2006.01)
*B23K 103/00* (2006.01)

(52) U.S. Cl.
CPC ............ *C09J 183/06* (2013.01); *C09J 183/08* (2013.01); *H01L 21/268* (2013.01); *B23K 2201/40* (2013.01); *B23K 2203/56* (2015.10); *H01L 21/2007* (2013.01); *H01L 21/76254* (2013.01); *H01L 21/76259* (2013.01); *H01L 2221/68318* (2013.01); *H01L 2221/68381* (2013.01)

(58) Field of Classification Search
CPC ..... H01L 2221/68381; H01L 21/67092; H01L 21/187; H01L 21/2007; H01L 21/76251; H01L 21/76254; H01L 21/76259; H01L 33/0079; B23K 26/0006; B23K 26/0057; B23K 2201/40; B23K 2203/56; C09J 183/06; C09J 183/08

See application file for complete search history.

(56) References Cited

U.S. PATENT DOCUMENTS

| | | | |
|---|---|---|---|
| 2005/0233547 A1 | 10/2005 | Noda et al. | |
| 2009/0026185 A1 | 1/2009 | Sakamoto | |
| 2009/0166896 A1* | 7/2009 | Yamazaki | H01L 21/76254 257/787 |
| 2010/0087045 A1* | 4/2010 | Shimomura | H01L 21/76254 438/458 |
| 2013/0017671 A1 | 1/2013 | Kitabayashi | |
| 2013/0257699 A1* | 10/2013 | Yamazaki | G11C 19/28 345/84 |
| 2014/0116615 A1* | 5/2014 | Ogawa | C09J 143/04 156/275.5 |
| 2014/0320777 A1* | 10/2014 | Fukushima | G02F 1/133305 349/43 |
| 2015/0118488 A1* | 4/2015 | Bai | C09J 5/06 428/354 |

FOREIGN PATENT DOCUMENTS

| | | |
|---|---|---|
| JP | 2003-163338 | 6/2003 |
| JP | 2004-064040 | 2/2004 |
| JP | 2004-179649 | 6/2004 |
| JP | 2006-043713 | 2/2006 |
| JP | 2009-155652 | 7/2009 |
| JP | 2013-026247 | 2/2013 |
| JP | 2013-033814 | 2/2013 |

OTHER PUBLICATIONS

Chinese Office Action dated Nov. 14, 2016 in corresponding Chinese Patent Application No. 201480012085.3.

* cited by examiner

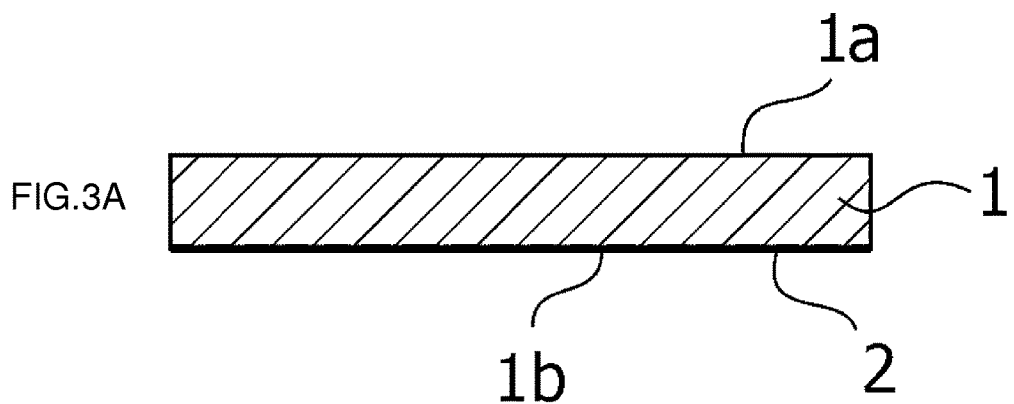
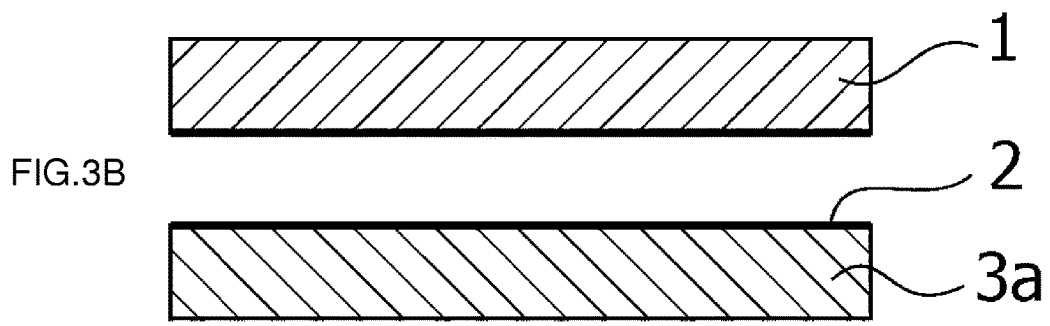
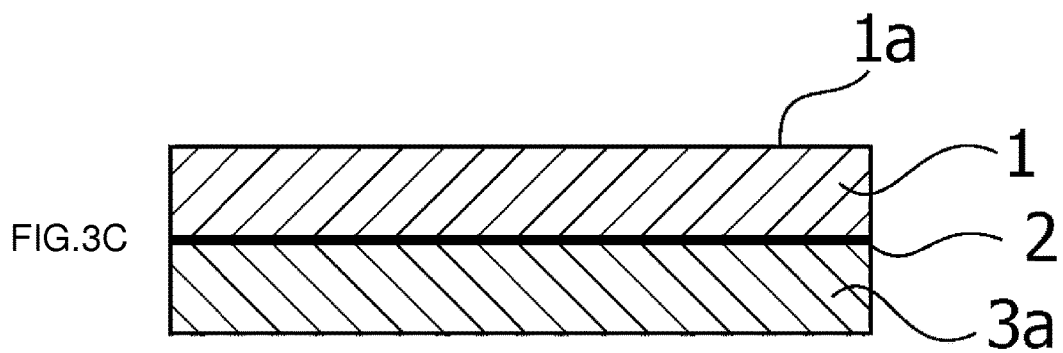

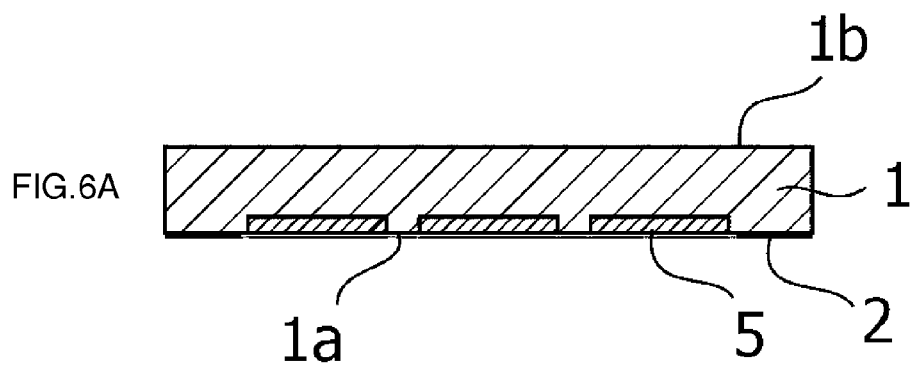
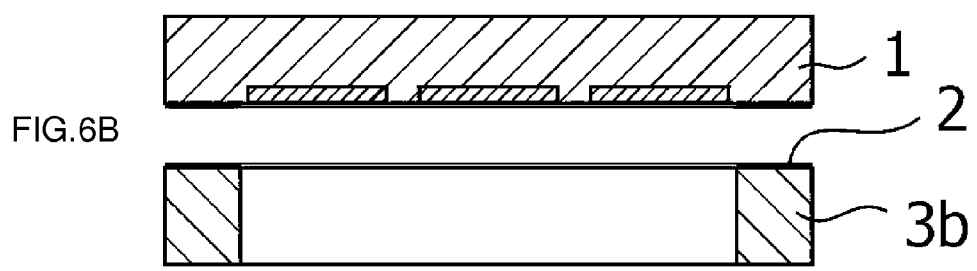
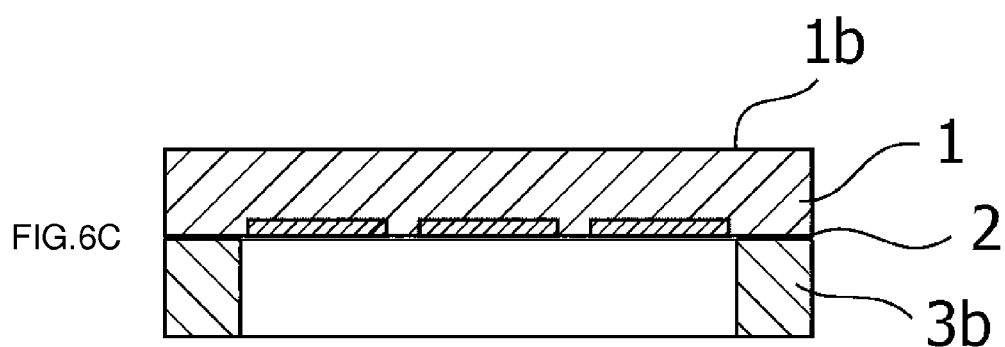

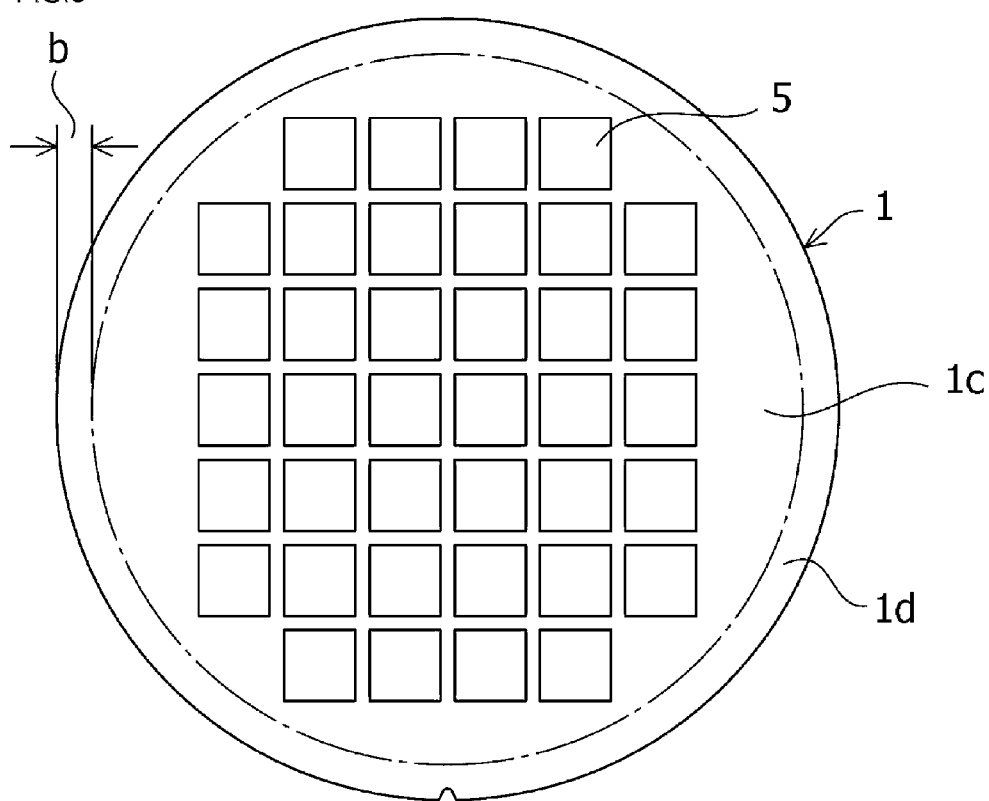

FIG.10A
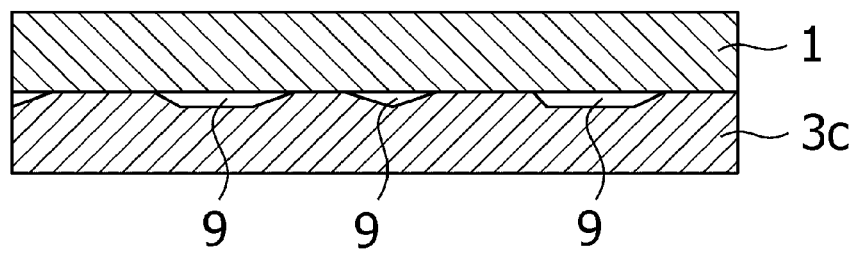
FIG.10B
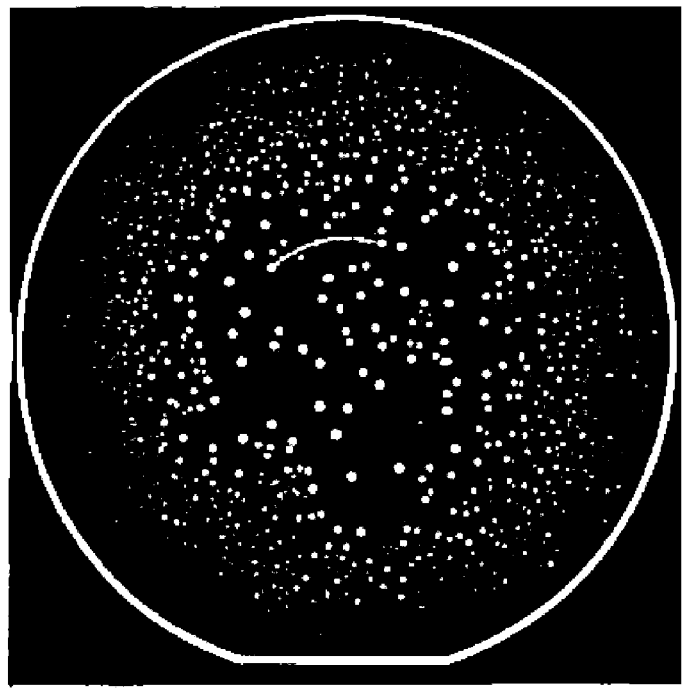
FIG.10C

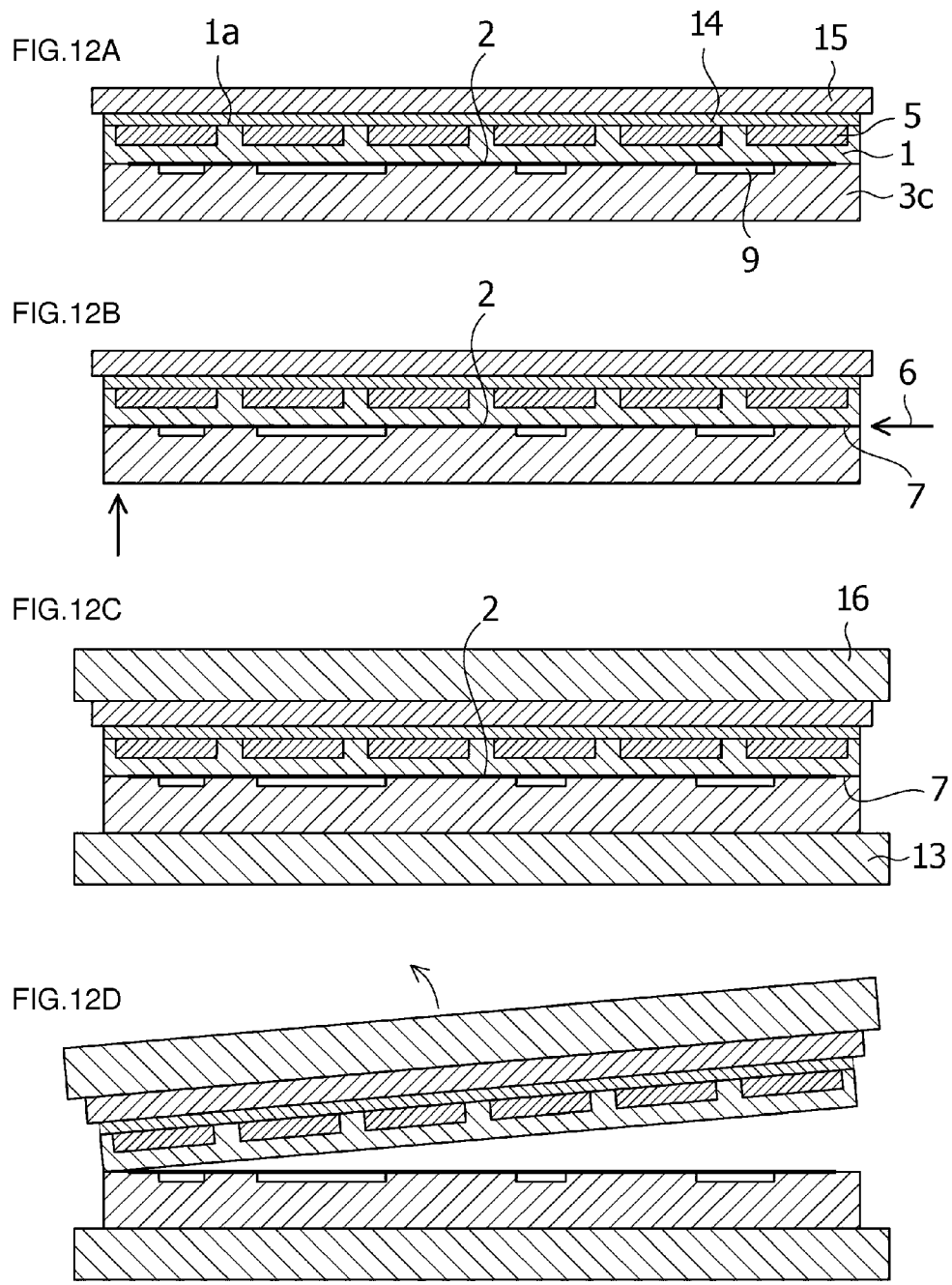

METHOD FOR MANUFACTURING SEMICONDUCTOR DEVICE

CROSS-REFERENCE TO RELATED APPLICATIONS

This application is a continuation application, filed under 35 U.S.C. §111(a), of International Application PCT/JP2014/059989 filed on Apr. 4, 2014, and claims benefit of foreign priority to Japanese Patent Application 2013-078570 filed Apr. 4, 2013, the disclosure of each of which is incorporated herein by reference.

BACKGROUND

1. Field

The present disclosure relates to a method for manufacturing a semiconductor device using a method in which a supporting substrate is bonded to a semiconductor wafer.

2. Description of Related Art

In recent years, rapid advances have been made in achieving more compact size and higher density in semiconductor devices. In accordance with this, there have been demands for reduction in the film thickness of semiconductor elements which are used in devices, and the need for semiconductor wafer thicknesses no more than 100 μm has arisen. If the thickness of a semiconductor wafer is reduced to no more than 100 μm, or if a device is formed using a semiconductor wafer of no more than 100 μm, warping occurs due to the insufficient strength of the semiconductor wafer, and therefore the reduction in the thickness of the individual semiconductor wafer, and formation of a device with same, have been impossible. Therefore, in order to supplement the strength of the semiconductor wafer so as to prevent the occurrence of warping, technology has been developed in which a supporting substrate is joined to the semiconductor wafer, then processing of thickness reduction and device formation are carried out.

The technology of joining the supporting substrate to the semiconductor wafer may, for example, use an organic adhesive, such as a polyimide or epoxy resin, or a low-melting-point wax, to bond the semiconductor wafer to the supporting substrate (Japanese Patent Application Publication No. 2004-64040 and Japanese Patent Application Publication No. H6-29385). With this technology, the semiconductor wafer is fixed to the supporting substrate by an organic adhesive or low-melting-point wax, and reduced film thickness is achieved by cutting or device formation. After cutting or device formation, the organic adhesive is caused to decompose by irradiating light, or the wax is melted by applying heat, and the semiconductor wafer is separated from the supporting substrate.

Possible technologies for joining the supporting substrate to the semiconductor wafer include, apart from the organic adhesive and low-melting-point wax described above, a technique in which the semiconductor wafer is fixed to the supporting substrate by protective tape.

The thermal resistance temperature of polyimide which is used as an organic adhesive is no higher than 400° C., and the thermal resistance temperature of epoxy resin is approximately 200° C. Furthermore, the thermal resistance temperature of low-melting-point wax is no higher than 100° C. Therefore, when it is necessary to manufacture a semiconductor device by carrying out processing including a high-temperature process at a diffusion temperature of approximately 1000° C., then organic adhesive and/or low-melting-point wax of this kind cannot be used since the semiconductor wafer cannot be held in a bonded state on the supporting substrate during this high-temperature process.

On the other hand, protective tape also presents problems with thermal resistance, similarly to adhesive, and is not suitable for manufacturing semiconductor devices which include a high-temperature process such as that described above. Furthermore, in the case of protective tape, there is a risk of causing cracks or chips in the semiconductor wafer due to the adhesive force, when the protective tape is separated.

SUMMARY

Embodiments of the invention were devised with the foregoing in view, an aspect thereof being to provide a method for bonding a supporting substrate to a semiconductor wafer, and a method for manufacturing a semiconductor device, whereby a semiconductor wafer can be maintained in a bonded state on a supporting substrate during a high-temperature process.

In order to resolve the abovementioned problem, the present inventors carried out thorough research into a method for manufacturing a semiconductor device which can be applied to a high-temperature process. As a result of this, it was found that by using a silane coupling agent to bond the supporting substrate to the semiconductor wafer, application to a high-temperature process is possible. Furthermore, it was also found that the supporting substrate can be separated from the semiconductor wafer when the bonding interface between the semiconductor wafer and the supporting substrate is irradiated with laser light, and that a semiconductor device can be manufactured by steps including a high-temperature process, by bonding and separating the supporting substrate to and from the semiconductor wafer by a silane coupling agent. The present inventors conceived embodiments of the present invention as a result of these findings.

More specifically, one aspect of the present invention is a method for manufacturing a semiconductor device, including: a rear surface bonding step for bonding at least a part of the rear surface of a semiconductor wafer, and a supporting substrate in use of a silane coupling agent; a functional structure forming step for forming a functional structure on a front surface of the semiconductor wafer; a fracture layer forming step for placing a condensation point of laser light transmitted through the semiconductor wafer on a bonding interface between the semiconductor wafer and the supporting substrate, and irradiating the bonding interface with the laser light, thereby forming a fracture layer on a part of an outer circumferential section of the bonding interface; a fracture layer separating step for separating the fracture layer; a bonding interface separating step for separating the bonding interface; and a rear surface processing step for carrying out rear surface processing on the rear surface of the semiconductor wafer.

According to embodiments of the present invention, it is possible to provide a method for manufacturing a semiconductor device using a method for bonding a supporting substrate to a semiconductor wafer, which can be applied to a high-temperature process at approximately 1000° C.

BRIEF DESCRIPTION OF THE DRAWINGS

These and/or other aspects and advantages will become apparent and more readily appreciated from the following description of the embodiments, taken in conjunction with the accompanying drawings of which:

FIGS. 3A through 3C are cross-sectional diagrams showing a rear surface bonding step, in the method for manufacturing according to embodiments of the present invention;

FIGS. 6A through 6C are cross-sectional diagrams showing a front surface bonding step, in the method for manufacturing according to embodiments of the present invention;

FIG. 8 is a plan diagram showing the front surface of the semiconductor wafer after the functional structure forming step;

FIGS. 10A and 10B are cross-sectional diagrams of a semiconductor wafer and supporting substrate when voids are present in the bonding interface between the semiconductor wafer and the supporting substrate, and FIG. 10C is an ultrasonic image of same;

FIGS. 12A through 12D are cross-sectional diagrams showing one embodiment of a fracture layer separating step and a bonding interface separating step according to embodiments of the present invention which are different to those in FIGS. 11A through 11D.

DESCRIPTION OF EMBODIMENTS

Figure 1:
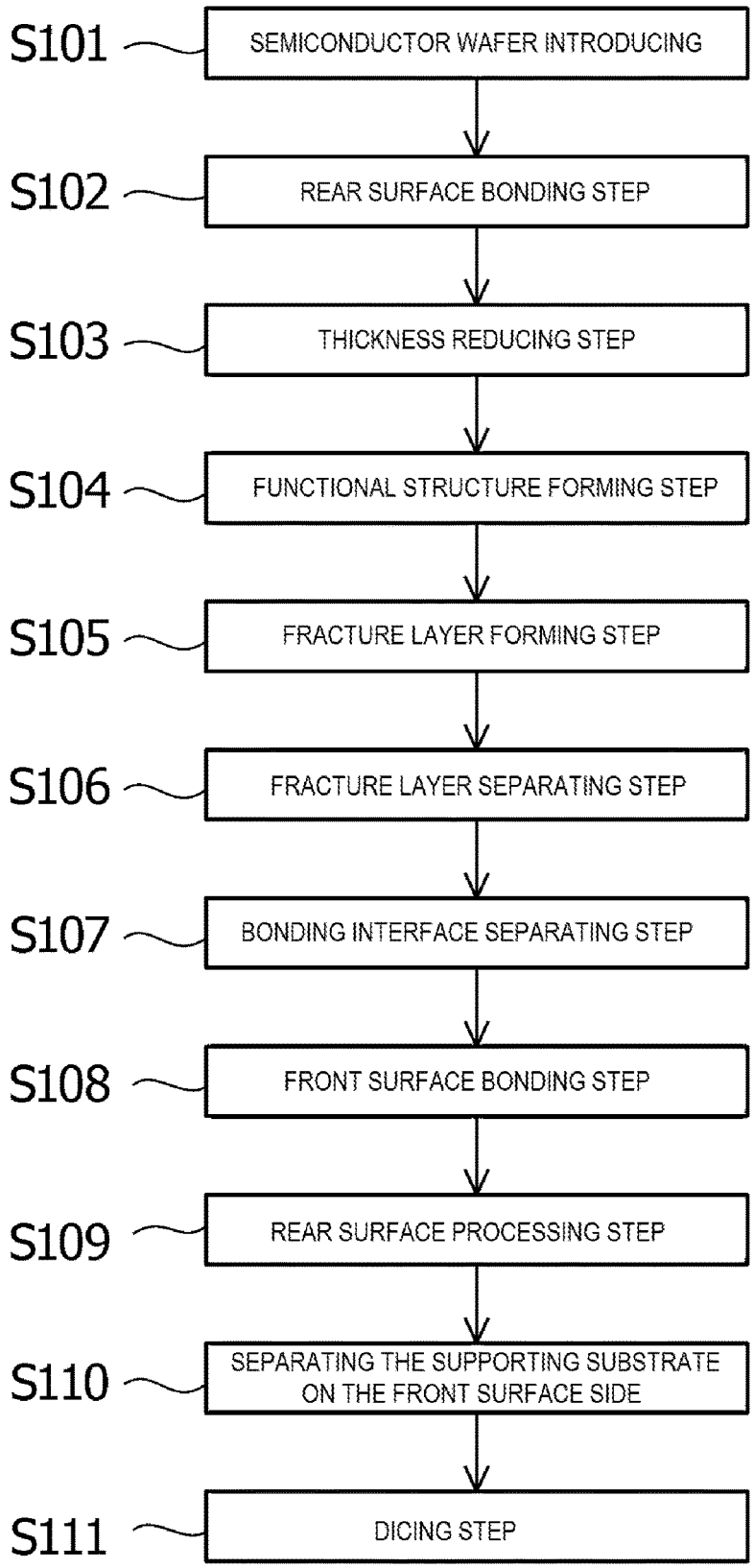
FIG. 1 is a process flow showing one example of a method for manufacturing a semiconductor device according to a first embodiment of the present invention.

One embodiment of the present invention is described below. The present invention is not limited to the embodiment described below.

A method for manufacturing a semiconductor device according to an embodiment of the present invention includes, at the least: a rear surface bonding step; a functional structure forming step; a fracture layer forming step; a fracture layer separating step; a bonding interface separating step; and a rear surface processing step. The rear surface bonding step is a step for bonding at least a part of the rear surface of a semiconductor wafer, and a supporting substrate, using silane coupling agent. The supporting substrate is bonded so as to avoid the occurrence of deformation or warping in the semiconductor wafer, due to high-temperature heating, etc. when forming the functional structure. Furthermore, in the process for forming the functional structure, a silane coupling agent is used so as to adequately guarantee bonding properties between the semiconductor wafer and the supporting substrate. The silane coupling agent can be applied to either one of the semiconductor wafer and the supporting substrate, and can also be applied to both the semiconductor wafer and the supporting substrate. In the rear surface bonding step, the supporting substrate is required to bond adequately to the semiconductor wafer, without impeding the formation of the functional structure and without damaging the functional structure that is formed. Provided that this bonding can be achieved, there is no need to bond the supporting substrate to the entirety of the rear surface of the semiconductor wafer, and it is sufficient to bond the supporting substrate to at least a part of the rear surface. The silane coupling agent is an organic silicon compound which has a molecule combining a reactive functional group and a hydrolyzable group and which has properties for coupling organic material and inorganic material. The reactive functional group may be an amino group, an epoxy group, a vinyl group, or the like, and the hydrolyzable group may be a methoxy group, an ethoxy group, or the like. The compound couples with the organic material via the reactive functional group and the hydrolyzable group is hydrolyzed and couples with the inorganic material.

The silane coupling agent can be applied by a normal method. A silane coupling agent is used by dilution in a solution mainly containing pure water, and is applied, for example, by a brush, roller, spray, spin coater, or the like. Furthermore, the silane coupling agent couples the semiconductor wafer and the supporting substrate due to heating. The coupling of the silane coupling agent can be performed by a normal method. For example, a silane coupling agent can bond the semiconductor wafer and the supporting substrate by heating for 10 minutes to 6 hours at 90° C. to 200° C.

Here, in the manufacturing steps relating to the method for manufacturing a semiconductor device according to embodiments of the present invention, if the thickness of the semiconductor wafer introduced into the steps is greater than the final thickness according to the design, then it is possible to provide a thickness reduction step for reducing the thickness of the semiconductor wafer after the surface bonding step. The thickness reduction step makes the thickness of the semiconductor wafer smaller than the initial thickness, by carrying out cutting or polishing on the front surface of the semiconductor wafer, on which the supporting substrate has not been bonded. The front surface of the semiconductor wafer, on which the supporting substrate has not been bonded, is fabricated to be flat, in such a manner that a functional structure can be formed in a subsequent functional structure forming step.

The functional structure forming step is a step for forming a functional structure on the front surface of the semiconductor wafer. Possible examples of this step are: a guard ring forming step for forming a P well or oxide film; a gate forming step for injecting ions into a channel region, performing heat treatment, removing an oxide film, forming a trench, forming a gate oxide film, and forming a polysilicon layer; an emitter forming step for injecting N-type impurity ions and performing heat treatment; and a contact forming step for injecting P-type impurity ions, performing heat treatment, forming an insulating film between layers, and forming electrodes; and so on.

The fracture layer forming step is a step in which a condensation point of laser light transmitted through the semiconductor wafer is placed on the bonding interface between the semiconductor wafer and the supporting substrate, the bonding interface is irradiated with the laser light, and a fracture layer is formed on at least a part of the outer circumferential portion of the bonding interface. The fracture layer is a layer which is modified by laser light and forms a start point when separating the supporting substrate. The bonding interface is the interface between the semiconductor wafer and the supporting substrate and contains a silane coupling agent layer.

A laser cutting method is already known in dicing technology for silicon semiconductor wafers (see, for example, Japanese Patent Application Publication No. 2006-43713). This cutting method involves aligning the focal point of the laser with the interior of the semiconductor wafer and performing a scanning action of the laser light irradiation in a lattice shape following chip cutting lines. Consequently, cut portions having a fracture layer inside a semiconductor wafer are formed in a lattice shape following the chip cutting lines. Thereupon, the dicing tapes which join the semiconductor wafers together are mechanically expanded to obtain separate chips. This method is also called "stealth dicing". In a laser scribing method in which laser light having a wavelength of high absorptivity by silicon material is focused onto the surface of a silicon semiconductor wafer, as in the prior art, aberration is liable to occur, a part of the silicon is scattered in the form of molten micro-particles, and especially around the edges of the cut portions, the molten micro-particles of silicon harden and give rise to silicon debris, thus preventing a clean cut face. Therefore, laser light which is transmitted through the semiconductor wafer is used and the focal point of the laser light is placed in the interior of the semiconductor wafer. By adopting this configuration, it is possible to form a fracture layer in the interior of the semiconductor wafer only, without leaving a trace of the laser light on the surface of the semiconductor wafer. The fracture layer is left in a state where the monocrystalline structure of the semiconductor wafer has been broken by the laser light, and therefore, the mechanical strength of the fracture layer is weaker than that of the semiconductor wafer itself. As a result of this, the separation at the boundary of the fracture layer can readily occur. In the present invention, the bonding interface between the semiconductor wafer and the supporting substrate is irradiated with laser light transmitted through the semiconductor wafer, by placing the condensation point of the laser light on the bonding interface. The fracture layer is formed in a part of the bonding interface. The fracture layer may be formed in the whole of the outer circumferential portion of the bonding interface, or may be formed in a part of the outer circumferential portion.

More specifically, the interior of the bonding interface is irradiated with laser light transmitted through the semiconductor wafer, in a direction from the side face of the semiconductor wafer towards the outer periphery of the supporting substrate, by placing the condensation point of the laser light inside the bonding interface, and fracture layers are formed respectively by performing irradiation in a ring shape through at least a certain length along the outer circumference, or in a required range in a partial region of the outer circumference of the semiconductor wafer. Since the fracture layer thus formed has weak mechanical strength, then the fracture layer can be separated easily, and taking this separation acts as a start point for a fracture which occurs towards the central portion of the semiconductor wafer. This fracture runs along the bonding interface, which is weakly coupled, and therefore the semiconductor wafer and the supporting substrate can be separated by gradually pulling the semiconductor wafer and the supporting substrate apart.

The fracture layer separating step is a step in which the fracture layer which has been modified by laser light at the fracture layer forming step is separated. The semiconductor wafer and the supporting substrate are respectively fixed, and the fracture layer is separated by applying force in a direction that breaks the fracture layer in the bonding interface, for example, a direction parallel to the bonding interface or a direction perpendicular to the bonding interface. One possible method for fixing the semiconductor wafer and the supporting substrate is, for instance, a method in which the front surface of the semiconductor wafer and the rear surface of the supporting substrate are respectively clamped by a vacuum chuck or an electrostatic chuck, using a suctioning apparatus or a wafer fixing stage.

The bonding interface separating step is a step for separating the bonding interface which has not been modified by the laser light. Similarly to the fracture layer separating step, by applying force in a direction that breaks the bonding interface, for example, a direction parallel to the bonding interface or a direction perpendicular to the bonding interface, a fracture occurs along the bonding interface, taking the separation of the fracture layer as a start point, and the bonding interface can be separated. Similarly to the fracture layer separating step, the bonding interface is separated by respectively fixing the semiconductor wafer and the supporting substrate. The bonding interface separating step is a step that is carried out either after the fracture layer separating step or simultaneously with the fracture layer separating step, depending on the state of formation of the fracture layer.

The method for manufacturing a semiconductor device according to embodiments of the present invention may include, apart from the steps described above, a step in which the semiconductor wafer is cooled while the front surface of the semiconductor wafer is fixed by a vacuum chuck, electrostatic chuck, or the like, and meanwhile, the supporting substrate is heated by a lamp, laser, hot plate, or the like, thereby separating the semiconductor wafer and the supporting substrate due to the difference in the thermal expansion thereof.

The rear surface processing step is a step for carrying out rear surface processing on the rear surface of the semiconductor wafer. Examples of this step are steps including ion injection and heat treatment, formation of electrodes, and the like.

The method for manufacturing the semiconductor device according to embodiments of the present invention may include, apart from the steps described above, a dicing step for dividing the semiconductor wafer into individual chips, and a plating step for forming an Au/Ni film on Al electrodes on the front surface of the semiconductor wafer.

In the method for manufacturing a semiconductor device according to embodiments of the present invention, it is possible to include a front surface bonding step for bonding a ring-shaped supporting substrate to the outer circumference region of the front surface of the semiconductor wafer where the functional structure is not formed, before the rear surface processing step. By this step, it is possible to prevent deformation or warping of the semiconductor wafer which has a chance of occurring due to the rear surface processing. On the front surface of the semiconductor wafer, there is a region where a functional structure is formed, and when the supporting substrate is bonded to this region, there is a risk that the functional structure will be broken. Therefore, by bonding the ring-shaped supporting substrate to the outer circumference region of the semiconductor wafer where the functional structure is not formed, the semiconductor wafer is reinforced.

In the front surface bonding step described above, the ring-shaped supporting substrate can be bonded by using a silane coupling agent. If a silane coupling agent is used, it is possible to adequately guarantee bonding properties between the semiconductor wafer and the supporting substrate, during the course of the rear surface processing which includes a high-temperature process. The silane coupling agent can be applied to either one of the semiconductor wafer and the supporting substrate, and can also be applied to both the semiconductor wafer and the supporting substrate.

In the method for manufacturing a semiconductor device according to embodiments of the present invention, voids may be present in the bonding interface between the semiconductor wafer and the supporting substrate. Due to the presence of gaps, such as voids, which are unbonded portions, in the bonding interface, the bonding interface can be separated easily in the bonding interface separating step. The voids can be formed by a processing for forming voids. Furthermore, there are cases where voids occur spontaneously.

In the method for manufacturing the semiconductor device according to an aspect of the present invention, desirably, in the fracture layer forming step, the bonding interface is irradiated with laser light from the side surface of the semiconductor wafer to which the supporting substrate has been bonded. There are cases where a device comprising an oxide film, polysilicon film, metal film, or the like, is formed on the surface of the semiconductor wafer, and in this case, the laser light is not transmitted and the bonding interface is not irradiated by laser light. Furthermore, there are cases where the functions of the device are inhibited by the irradiation of laser light. The side surface of the semiconductor wafer is the surface forming the outer circumferential portion of the semiconductor wafer.

In the method for manufacturing a semiconductor device according to an aspect of the present invention, desirably, the bonding interface is irradiated with the laser light from a direction perpendicular to the bonding interface. In this case, the irradiation may be performed from the semiconductor wafer side or from the supporting substrate side. If irradiation is performed from the semiconductor wafer side, then the laser output must be of a level that does not affect the device. If irradiation of laser light is performed from an oblique direction that is inclined from the perpendicular direction, then there are cases where the laser light is reflected at the surface of the supporting substrate and it is not possible to transmit sufficient energy to the bonding interface. Furthermore, there is a possibility of causing damage to the interior and exterior of the laser irradiation device. This is because a device comprising an oxide film, a polysilicon film, a metal film, and the like, is formed on the surface of the Si wafer, and therefore the laser light is not transmitted.

In the method for manufacturing a semiconductor device according to an aspect of the present invention, it is possible to use a Si wafer as a semiconductor wafer, but the wafer is not limited to this and it is also possible to employ a SiC wafer or a GaN wafer.

In the method for manufacturing a semiconductor device according to an aspect of the present invention, for the supporting substrate, it is desirable to use any substrate selected from a high-thermal-resistance glass, an Si wafer, an Si wafer having an $SiO_2$ layer on the surface thereof, and an SiC wafer. The high-thermal-resistance glass may be quartz glass, borosilicate glass, aluminosilicate glass, or the like. This is because, if one of these substrates is used, good bonding properties with the silane coupling agent are obtained, and the strength of the semiconductor wafer can be supplemented sufficiently. The Si wafer having a $SiO_2$ layer on the surface thereof is a Si wafer having a $SiO_2$ layer on at least one of the bonding surface which is bonded to the semiconductor wafer and the rear surface of the bonding surface. Here, the larger the thickness of the supporting substrate, the greater the extent to which the strength of the semiconductor wafer is supplemented, but an excessively thick supporting substrate may become an obstacle to conveyance between manufacturing devices and handling within a manufacturing device. Consequently, it is possible to use a supporting substrate whereby the thickness after joining together of the semiconductor wafer and the supporting substrate is that of a general semiconductor wafer until introduction (for example 600 μm to 700 μm). Furthermore, the supporting substrate which is separated from the semiconductor wafer by the bonding interface separating step can be used repeatedly for reinforcing semiconductor wafers.

In a method for manufacturing a semiconductor device according to an aspect of the present invention, desirably, the silane coupling agent is at least one silane selected from: vinyl silane, epoxy silane, styryl silane, methacryl silane, acryl silane, amino silane, ureide silane, mercapto silane, sulfide silane, and isocyanate silane. These silane coupling agents have good close contact properties with the semiconductor wafer and supporting substrate, and also have thermal resistance which allows application to a high-temperature process at approximately 1000° C.

If an Si wafer is used as a semiconductor wafer, then the hydroxyl groups produced by hydrolysis of the hydrolyzable functional groups such as methoxy groups of the silane coupling agent, and the hydroxyl groups on the surface of the Si wafer attract each other, and when the water is removed by heating, Si—O—Si—C is formed, and the silane coupling agent and the Si wafer are coupled together. Other semiconductor wafers are coupled by a similar mechanism. Furthermore, the silane coupling agent and the supporting substrate are also coupled together by a similar mechanism. The silane coupling agent is applied to achieve a film thickness sufficiently greater than the molecular length, on top of the semiconductor wafer. Therefore, a large number of hydrolyzable functional groups which are not coupled with the semiconductor wafer are present in the silane coupling agent, and these couple with the supporting substrate. The semiconductor wafer and the supporting substrate are coupled together due to the occurrence of a copolymerization reaction between the reactive functional groups in the silane coupling agent present on the semiconductor wafer and the supporting substrate. In other words, the semiconductor wafer and the supporting substrate are coupled together via the silane coupling agent, by heating, and a stacked structure comprising the semiconductor wafer, the silane coupling agent and the supporting substrate can be obtained. Therefore, pre-treatment may be carried out by UV, or ozone treatment, or the like, before applying the silane coupling agent.

Possible examples of a vinyl silane are: vinyl triethoxy silane; vinyl trimethoxy silane; vinyl tris(2-methoxy ethoxy) silane; and vinyl methyl dimethoxy silane; possible examples of a epoxy silane are: 2-(3,4-epoxy cyclohexyl) ethyl trimethoxy silane; 3-glycidoxy propyl trimethoxy silane; 3-glycidoxy propyl triethoxy silane; 3-glycidoxy propyl methyl diethoxy silane; and 3-glycidoxy propyl triethoxy silane; a possible example of a styryl silane is: p-styryl trimethoxy silane; possible examples of a methacryl silane are: 3-methacryloxy propyl methyl dimethoxy silane; 3-methacryloxy propyl trimethoxy silane; 3-methacryloxy propyl methyl diethoxy silane; and 3-methacryloxy propyl triethoxy silane; a possible example of an acryl silane is: 3-acryloxy propyl trimethoxy silane; possible examples of an amino silane are: N-2-(amino ethyl)-3-amino propyl methyl dimethoxy silane; N-2-(amino ethyl)-3-amino propyl trimethoxy silane; N-2-(amino ethyl)-3-amino propyl trimethoxy silane; 3-amino propyl trimethoxy silane; 3-amino propyl triethoxy silane; 3-triethoxy silyl-N-(1,3-diemethyl-butylidene) propyl amine; N-phenyl-3-amino propyl trimethoxy silane; and a hydrochloride salt of N-(vinyl benzyl)-2-amino ethyl-3-amino propyl trimethoxy silane; a possible example of an ureide silane is 3-ureide propyl triethoxy silane; possible examples of a mercapto silane are 3-mercapto propyl methyl dimethoxy silane; and 3-mercapto propyl trimethoxy silane; a possible example of a sulfide silane is bis (triethoxy silyl propyl) tetrasulfide; and a possible example of an isocyanate silane is 3-isocyanate propyl triethoxy silane.

In a method for manufacturing a semiconductor device according to an aspect of the present invention, desirably, the thickness of the semiconductor wafer before the rear surface bonding step is less than 300 μm with a 6-inch-diameter wafer, and less than 400 μm with an 8-inch-diameter wafer. By setting these thicknesses, it is possible to reduce the portion discarded when the semiconductor wafer is made thinner by cutting or chemical mechanical polishing, and therefore the cost of the semiconductor wafer can be reduced sufficiently. Furthermore, the thickness of the semiconductor wafer when the semiconductor device is finished is selected in accordance with the desired characteristics of the semiconductor device. For example, the thickness is several 10 μm to 200 μm.

Next, an embodiment of the method for manufacturing the semiconductor device according to the present invention is described in more detail with reference to the drawings. In this case, the present invention is not limited to the embodiments relating to the drawings.

(First Embodiment)

FIG. 1 is a process flow showing one example of a method for manufacturing a semiconductor device according to an embodiment of the present invention. In step S101 in FIG. 1, a semiconductor wafer is introduced into the manufacturing steps. This semiconductor wafer is a wafer made of silicon, which has diameter of 6 inches and a thickness of 500 μm. Since a supporting substrate is joined with the semiconductor wafer in the rear surface bonding step in the subsequent step, S102, then it is possible to make the thickness of the semiconductor wafer upon introduction to the manufacturing steps smaller than 500 μm. For example, it is possible to introduce a semiconductor wafer having a thickness of approximately 300 μm. By using semiconductor wafer having a small thickness upon introduction to the manufacturing steps, it is possible to reduce the amount of silicon that is removed in the thickness reduction step, which is described below.

Next, in the rear surface bonding step in step S102, the whole or a part of the rear surface of the semiconductor wafer with bonded with the supporting substrate by using a silane coupling agent. The supporting substrate is bonded so as to avoid the occurrence of deformation or warping in the semiconductor wafer, due to high-temperature heating, etc. when forming the functional structure. For the supporting substrate, it is possible to use a substrate of a shape having the same cross-section as the semiconductor wafer, for example. Here, the silane coupling agent may be applied to the rear surface of the semiconductor wafer only, or may be applied to the supporting substrate only. Furthermore, the silane coupling agent may also be applied to both the rear surface of the semiconductor wafer and the supporting substrate. Moreover, the silane coupling agent may be applied to the whole of the application surface on the semiconductor wafer and the supporting substrate, or may be applied to a part of the application surface. More specifically, it is sufficient to bond one portion of the bonding surfaces, provided that a desired bonded strength is obtained and no problems arise in the subsequent manufacturing steps of the semiconductor device.

The bonding of the semiconductor wafer and the supporting substrate can be completed, for example, by forming a stacked body by stacking the semiconductor wafer and the supporting substrate, via the silane coupling agent, and then applying heat treatment for 2 hours at 100° C. Furthermore, pressure may be applied in a range from 1.5 to 5 atmospheres.

Next, in the thickness reducing step in step S103, the thickness of the semiconductor wafer is reduced. The final thickness of the semiconductor wafer when the semiconductor device has been formed on the semiconductor wafer is approximately 40 μm to 120 μm in accordance with the voltage resistance of the semiconductor device. Here, the thickness of the semiconductor wafer needs to be made less (reduced) than the thickness of the semiconductor wafer upon introduction into the manufacturing steps. In the thickness reducing step, the semiconductor wafer is fabricated to reduce the thickness of the semiconductor wafer upon introduction into the manufacturing steps, to a prescribed thickness. The fabrication method may employ polishing by rubbing a grindstone against the surface of the semiconductor wafer to which the supporting substrate is not bonded, or Chemical Mechanical Polishing (CMP). Here, the surface of the semiconductor wafer on which the supporting substrate is not bonded needs to be fabricated to become flat, in such a manner that a functional structure can be formed in a subsequent functional structure forming step.

Next, in the functional structure forming step in S104, a functional structure is formed on the front surface of the semiconductor wafer. This step may be, for example, a step for forming a deep diffusion layer. For instance, when forming an IGBT (insulated gate bipolar transistor) as a semiconductor device, a p-type diffusion layer (p base region) is formed on the front surface side of the semiconductor wafer. Impurity ions are injected selectively into the formation region of the diffusion layer, and the impurity is subsequently diffused by carrying out heat treatment for several hours at 1000° C. This p-type diffusion layer requires diffusion to a depth of approximately 10 μm from the surface of front surface side of the semiconductor wafer, and also requires high-temperature heat treatment of long duration.

In embodiments of the present invention, the semiconductor wafer of which the thickness has been reduced is fixed to the supporting substrate by a silane coupling agent, and consequently there are no problems such as breaking of the semiconductor wafer, when the wafer is conveyed between manufacturing devices during ion injection and heat treatment. Furthermore, since the silane coupling agent has heat resistant, then even if heat treatment exceeding 1000° C. is carried out, the semiconductor wafer does not separate.

Other possible examples of steps involved in the functional structure forming step in step S104 are: ion injection and heat treatment for forming a channel region; forming a trench; forming a gate oxide film; forming an emitter region by n-type impurity ion injection and heat treatment; forming an insulating film between layers; forming electrodes, and so on.

When the functional structure is formed on the front surface side of the semiconductor wafer, the method then advances to the step for the rear surface of the semiconductor wafer, but before this, the supporting substrate is separated from the semiconductor wafer by the steps in S105 through S107. Firstly, in the fracture layer forming step in step S105, the condensation point of the laser light transmitted through the semiconductor wafer is placed on the silane coupling agent layer which bonds the semiconductor wafer and the supporting substrate, and the silane coupling agent is irradiated with the laser light, thereby forming a fracture layer in at least one portion of the outer circumferential portion of the bonding interface. The fracture layer which has been modified by laser light forms a start point when separating the supporting substrate.

In the fracture layer separating step in step S106, the fracture layer formed in step S105 is separated, and in the bonding interface separating step in step S107, the bonding interface which has not been modified by the laser light is separated. The fracture layer separating step and the bonding interface separating step are consecutive steps, and the separation of the bonding interface can be carried out in a continuous fashion following the separation of the fracture layer. Furthermore, depending on the shape of the formation portions of the fracture layer, the separation of the fracture layer and the separation of the bonding interface may be carried out simultaneously, for instance, in cases where the fracture layer is provided in a ring shape following the outer circumference of the semiconductor wafer. By the steps in S105 through S107, the supporting substrate can be separated from the semiconductor wafer, taking the fracture layer as a start point.

Thereupon, desirably, the supporting substrate is joined and bonded to the front surface side of the semiconductor wafer, in the front surface bonding step in step S108. This supporting substrate on the front surface side serves to prevent damage to the functional structure on the front surface side which has completed formation, when the front surface of the semiconductor wafer is fixed to the manufacturing device during formation of the rear surface structure in the step described below. A material which can withstand the step for forming the rear surface structure should be used for the supporting substrate on the front surface side. Furthermore, for the supporting substrate, it is possible to use a substrate of a shape having the same cross-section as the semiconductor wafer, for example. Furthermore, the supporting substrate may be ring-shaped. An organic adhesive, such as resin, can be used to bond the supporting substrate on the front surface side, provided that the bonding agent is resistant to the temperature and chemicals used in the step for forming the rear surface structure.

Next, in the rear surface processing step in step S109, the rear surface structure is formed. A possible example of the step for forming the rear surface structure is a step for injecting ions and performing heat treatment to form a semiconductor region on the rear surface (for example a collector region), and then forming electrodes. In forming the semiconductor region on the rear surface, a high-temperature process of long duration is not carried out, such as when forming a deep diffusion layer in the front surface side, and therefore it is possible to use an organic adhesive, such as resin, when bonding the supporting member to the front surface of the semiconductor wafer.

Next, desirably, in the step of separating the supporting substrate on the front surface side in step S110, the supporting substrate on the front surface side is separated. For example, it is possible to use an adhesive of which the adhesive force can be eliminated by irradiation with ultraviolet light, or an adhesive of which the adhesive force can be eliminated by heating.

Thereupon, desirably, in the dicing step in S111, the semiconductor wafer is cut up by a dicing saw, or the like, to obtain individual semiconductor devices. Furthermore, the supporting substrate may also be separated after dicing. When the supporting substrate is separated after dicing, there is a risk of causing chips in the supporting substrate, and therefore it is desirable to carry out dicing after separation.

According to the first embodiment described above, it is possible to use a semiconductor wafer which has small thickness upon introduction, compared to the prior art, and therefore the amount of waste of the semiconductor wafer material due to cutting in the thickness reducing step, etc. can be reduced. Furthermore, even if a semiconductor wafer of small thickness is used, due to the reinforcing effect of the supporting substrate, the wafer is able to resist the temperature of the heat treatment in the front surface diffusion step, and hence deformation and warping of the semiconductor wafer can be prevented.

(Second Embodiment)

Figure 2:
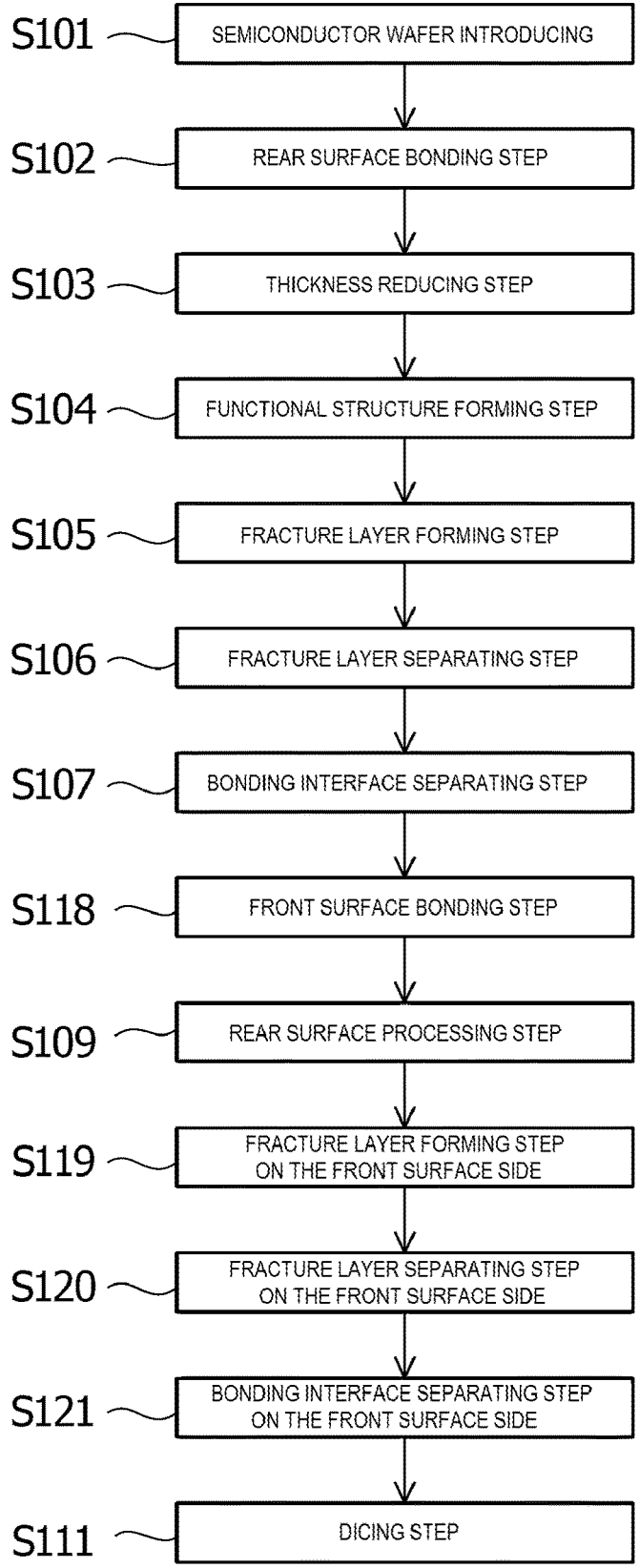
FIG. 2 is a process flow showing one example of a method for manufacturing a semiconductor device according to a second embodiment of the present invention which is different to the first embodiment.

FIG. 2 is a process flow showing one example of a method for manufacturing a semiconductor device according to a second embodiment of the present invention which is different to the first embodiment. The steps from S101 through S107 and the rear surface processing step in S109 are the same as in the first embodiment (FIG. 1), and therefore description thereof is omitted here. In the second embodiment, in contrast to the first embodiment, the method transfers the dicing step in step S111 after passing through step S118 and steps S119 through S121.

In the front surface bonding step in step S118, a silane coupling agent is applied to a supporting substrate (made from heat-resistant glass, for example), which has a ring shape, for example, and the supporting substrate is bonded to the front surface side of the semiconductor wafer on which a functional structure has been formed. The outer diameter of the ring-shaped supporting substrate is the same as the outer diameter of the semiconductor wafer. On the front surface of the semiconductor wafer, there is an outer circumference region where the device is not formed at the outer circumference of the device forming region, and the width of the ring-shaped bonding surface on the ring-shaped supporting substrate is approximately the same as the width of this outer circumference region. Furthermore, the thickness of the ring-shaped supporting substrate should be a thickness that ensures the strength of the semiconductor wafer, for example, 300 μm.

The ring-shaped supporting substrate is placed in close contact with the front surface of the semiconductor wafer via the silane coupling agent, and heat treatment is carried out for two hours at 100° C., thereby bonding the supporting substrate to the semiconductor wafer. The ring-shaped supporting substrate is bonded to the outer circumference region of the semiconductor wafer where the device is not formed, and therefore the functional structure on the front surface side that has already been formed is not damaged by the bonding of the ring-shaped supporting substrate.

After the rear surface processing step in S109, the ring-shaped supporting substrate bonded to the front surface of the semiconductor wafer is separated by a fracture layer forming step on the front surface side in step S119, a fracture layer separating step on the front surface side in step S120, and a bonding interface separating step on the front surface side in step S121. These steps are similar to S105 through S107, and firstly, a fracture layer is formed by irradiating the silane coupling agent layer that bonds the semiconductor wafer and the ring-shaped supporting substrate with laser light. Thereupon, the supporting substrate is separated from the semiconductor wafer by taking the fracture layer as a start point.

Finally, in the dicing step in S111, the semiconductor wafer is cut up to obtain individual semiconductor devices. Furthermore, the supporting substrate may also be separated after dicing. When the supporting substrate is separated after dicing, there is a risk of causing chips in the supporting substrate, and therefore it is desirable to carry out dicing after separation.

(Third Embodiment)

Here, in step S101 in FIG. 1, a semiconductor wafer which has undergone a mirror polishing process on the front surface side is introduced into the manufacturing steps. This semiconductor wafer is a wafer made of silicon, which has a diameter of 6 inches and a thickness of 300 µm. Since the front surface side has undergone a mirror polishing process, the processing on the front surface side can be started immediately after introduction into the manufacturing steps.

Since a supporting substrate is joined with the semiconductor wafer in the rear surface bonding step in step S102, then it is possible to reduce the thickness of the semiconductor wafer upon introduction to the manufacturing steps. By using a semiconductor wafer having a small thickness upon introduction to the manufacturing steps, it is possible to reduce the amount of silicon which is removed in the thickness reduction step, which is described below.

Next, the rear surface of the semiconductor wafer is bonded with the supporting substrate. The supporting substrate may be bonded by the step described in the rear surface bonding step in S102 of the first embodiment, but since the front surface side of the semiconductor wafer has already undergone a mirror polishing process, in order to avoid damage to this surface, it is possible to apply the silane coupling agent to the supporting substrate side and then place the rear surface of the semiconductor wafer on top of this silane coupling agent layer. Since the semiconductor wafer and the supporting substrate are bonded together by using a silane coupling agent, the process is similar to step S102 of the first embodiment, and therefore repeated description thereof is omitted here.

In the functional structure forming step, according to the third embodiment, since the front surface of the semiconductor wafer has already undergone a mirror polishing process at the start, then the functional structure is formed after bonding the supporting substrate. The functional structure forming step is similar to step S104 in FIG. 1, and therefore, repeated description thereof is omitted here.

After forming the functional structure on the front surface side of the semiconductor wafer, the method advances to the rear surface processing for the semiconductor wafer, but before this, the supporting substrate is separated from the semiconductor wafer. The separation of the supporting substrate is similar to steps S105 through S107, and therefore repeated description thereof is omitted here.

Next, the ring-shaped supporting substrate is bonded to the front surface of the semiconductor wafer by a front surface bonding step. This step is similar to the front surface bonding step in S118 of the second embodiment.

By this front surface bonding step, after bonding a ring-shaped supporting substrate to the front surface of the semiconductor wafer, thereby reinforcing the semiconductor wafer, the thickness of the semiconductor wafer is reduced to a desired thickness. In the first embodiment, the thickness of the semiconductor wafer is reduced from the front surface side thereof, but in the third embodiment, the thickness is reduced from the rear surface side of the semiconductor wafer. In the semiconductor wafer thickness reducing step, the semiconductor wafer is fabricated to reduce the thickness of the semiconductor wafer upon introduction into the manufacturing steps, to a prescribed thickness. The fabrication method may employ polishing by rubbing a grindstone against the surface of the semiconductor wafer to which the supporting substrate has not been bonded, or may employ CMP. The final thickness of the semiconductor wafer when the semiconductor device has been formed on the semiconductor wafer is approximately 40 µm to 120 µm in accordance with the voltage resistance of the semiconductor device.

The front surface side of the semiconductor wafer is now in a state in which a ring-shaped supporting substrate has been bonded to the outer circumference region. In other words, the portion of the chip forming region where the functional structure, and the like, is formed has the thickness of the semiconductor wafer, and the outer circumference region has the thickness of the semiconductor wafer plus the thickness of the supporting substrate. In this state, it is difficult to reduce the thickness on the rear surface by fixing the front surface side of the semiconductor wafer by suction, and therefore the step difference section which is produced by the thickness of the supporting substrate is filled with a resin that can be separated, so as to make the whole front surface side flat, whereupon the wafer is fixed by suction. Alternatively, the semiconductor wafer may be suctioned to a stage having a step difference of the same shape as the step difference caused by the thickness of the supporting substrate.

Next, a rear surface structure is formed by the rear surface processing step in step S109 according to the first embodiment. The supporting substrate on the front surface side is separated by the respective steps in S119 through S121 according to the second embodiment. Finally, individual semiconductor devices are obtained by dicing in the step S111 according to the first embodiment.

(Fourth Embodiment)

The following embodiment can also be applied, for example, as an embodiment which uses the ring-shaped supporting substrate described in the second embodiment.

In the third embodiment, a semiconductor wafer of which the front surface side has undergone a mirror polishing process is introduced to the manufacturing steps, but in the fourth embodiment, a semiconductor wafer before a mirror polishing process of this kind may be introduced in step S101 in FIG. 1. As in the third embodiment, a polishing step for polishing the front surface of the semiconductor wafer may be added after the supporting substrate has been bonded to the rear surface of the semiconductor wafer. By adding a polishing step in this way, it is possible to apply an inexpensive semiconductor wafer before the mirror polishing process. When a high-temperature process of long duration is involved in the rear surface processing step, then it is possible to use the second, third or fourth embodiments described above.

A further embodiment of the method for manufacturing a semiconductor device according to the present invention is now described with reference to FIGS. 3A through 12D.

FIGS. 3A through 3C are cross-sectional diagrams showing a rear surface bonding step in the method. The semiconductor wafer 1 has a front surface 1a and a rear surface 1b, wherein a silane coupling agent 2 is applied to substantially the whole surface of the rear surface 1b (FIG. 3A). The silane coupling agent 2 is used by being diluted in pure water, or the like, so as to have a prescribed concentration. The concentration of the silane coupling agent 2 affects the bonding strength of the semiconductor wafer 1 and the supporting substrate, and the ease of separation. As the concentration becomes higher, the number of molecules of the silane coupling agent 2 which contribute to coupling increases, and therefore the bonding strength rises. On the other hand, separation becomes harder to perform. Consequently, a desirable range of concentration which satisfies both the strength required for polishing and formation of the functional structure, etc., and the ease of separation, is 0.1 wt % to 2.0 wt %. Subsequently, the silane coupling agent 2 is applied to substantially the whole of the surface of the supporting substrate 3a (FIG. 3B), and the semiconductor wafer 1 and the supporting substrate 3a are joined together (FIG. 3C). Next, the supporting substrate 3a can be bonded to the semiconductor wafer 1 by causing the silane coupling agent 2 to react by heating for 10 minutes to 6 hours at 90° C. to 200° C., for example. Provided that the supporting substrate 3a can be bonded to the semiconductor wafer 1, it is also possible to join the semiconductor wafer 1 and the supporting substrate 3a by applying silane coupling agent 2 to only a part of the rear surface 1b of the semiconductor wafer 1.

Figure 4A:
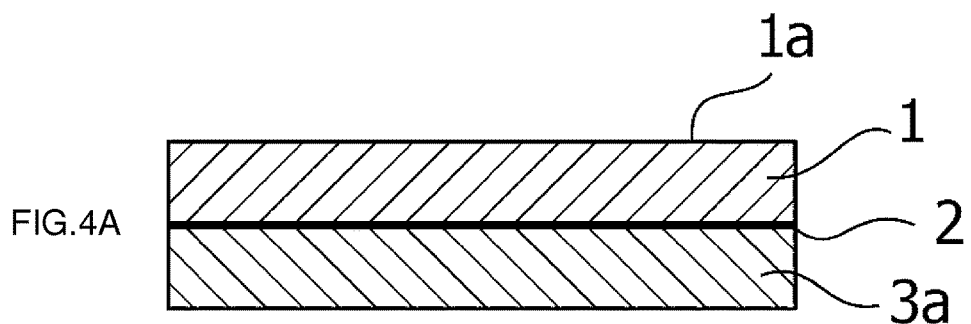
FIGS. 4A through 4C are cross-sectional diagrams showing a functional structure forming step, a fracture layer forming step, a fracture layer separating step and a bonding interface separating step.
Figure 4B:
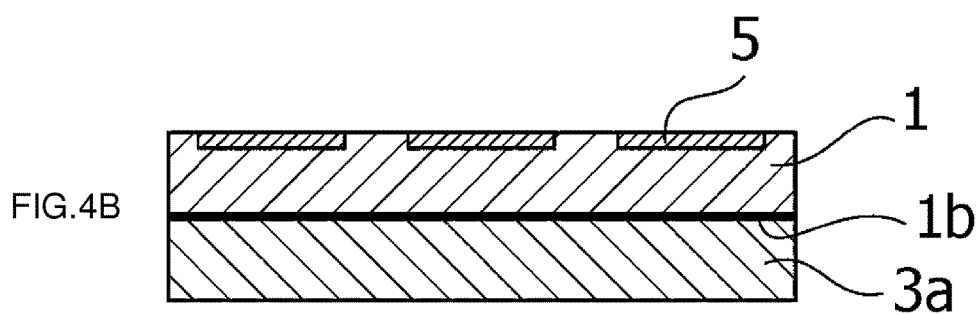
Figure 4C:
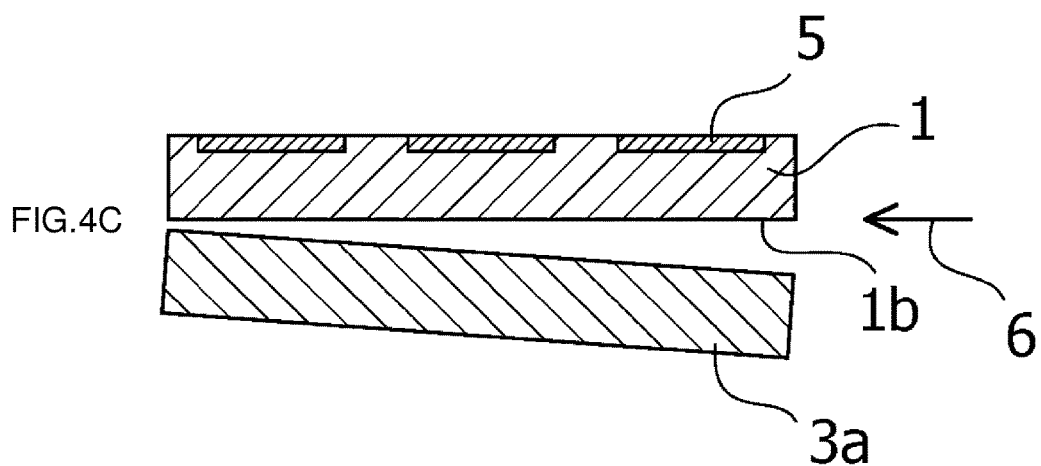

FIGS. 4A through 4C are cross-sectional diagrams showing a functional structure forming step, a fracture layer forming step, a fracture layer separating step and a bonding interface separating step. The semiconductor wafer 1 to which the supporting substrate 3a has been bonded by the steps in FIGS. 3A through 3C (FIG. 4A) is subjected to a guard ring forming step, a gate forming step, an emitter forming step and a contact forming step, and the like, thereby forming a front surface side functional structure 5 (FIG. 4B). After the front surface side functional structure 5 has been formed, as indicated by the arrow in FIG. 4C, a fracture layer is formed by irradiating with laser light 6 focused from the outer circumference edge towards the inner side of the bonding interface of the rear surface 1b of the semiconductor wafer 1, in a parallel fashion to the front surface 1a of the semiconductor wafer 1 (FIG. 4C). This irradiation of laser light 6 is a preparatory step for separating the supporting substrate 3a from the semiconductor wafer 1.

Figure 5A:
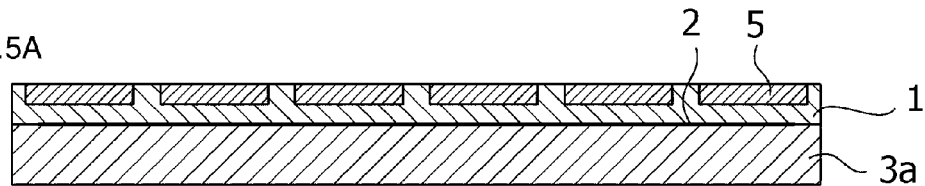
FIGS. 5A through 5D are cross-sectional diagrams and plan diagrams of a semiconductor wafer illustrating a fracture layer separating step and a bonding interface separating step according to embodiments the present invention.
Figure 5B:
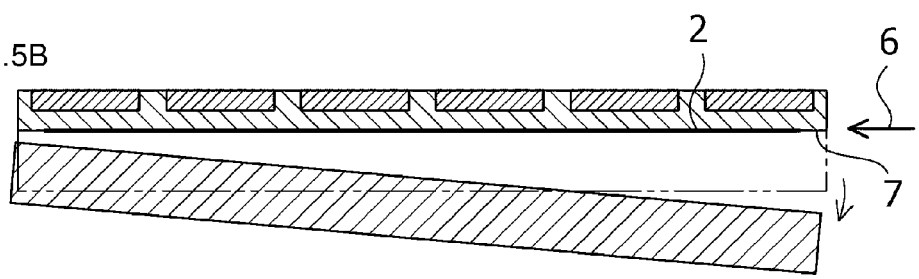

The separating step which includes a preparatory step for separating the supporting substrate 3a from the semiconductor wafer 1 is further described now with reference to FIGS. 5A through 5D. As shown in FIG. 5B, a fracture layer 7 is provided in the bonding interface by irradiating the bonding surface of the semiconductor wafer 1 and the supporting substrate 3a, which have completed the process for forming the front surface side functional structure 5, with laser light 6 focused from the outer circumference edge section of the bonding interface towards the inner side thereof, and performing a scanning action of the laser light. In this, it is desirable for irradiation of the laser light 6 to be performed from a deep position, and therefore preferably, the laser light 6 is moved from the inner side of the bonding layer to the edge of the outer circumferential portion. Firstly, the fracture layer 7 is provided in the inner portion. Thereupon, the fracture layer 7 is formed towards the outer circumference edge portion, which is open and not coupled, thereby completing a uniform fracture layer. The length of the fracture layer 7 from the outer circumference edge portion to the inner side may be the diameter of the wafer, but desirably, the distance from the outer circumference edge portion is 1 mm to 20 mm, and more desirably, 2 mm to 5 mm. Provided that the length is between 1 mm and 20 mm, separation is possible, and the shorter the length, the shorter the processing time and hence the more desirable. The fracture layer 7 can be caused to separate along the bonding interface, provided that interface separation occurs from a start point at a width of 1 mm to 20 mm. To create this start point, the wafer must be suctioned and lifted up as shown in FIG. 11C, and therefore due to these mechanical restrictions, there are cases where a fracture layer 7 is formed to approximately 20 mm.

Figure 5C:
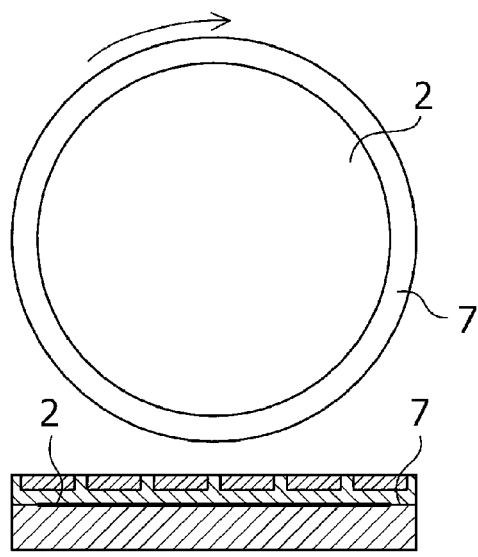
Figure 5D:
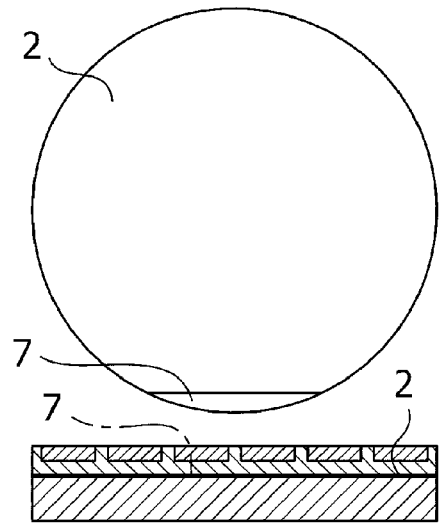

The length of the fracture layer 7 in the circumferential direction may be the whole circumference (FIG. 5C), and although the fracture layer 7 does not have to be provided about the whole circumference, it is desirably formed to a length of approximately half of the circumference. When forming the fracture layer 7 about the whole circumference, desirably, the wafer is rotated in the direction of the arrow while irradiating with laser light as indicated by FIG. 5C. Furthermore, irradiation does not have to be performed in a circumferential direction, and the fracture layer 7 can also be formed by performing irradiation in central direction from the outer circumference edge in one portion of the outer circumference edge of the bonding interface of the semiconductor wafer 1, and performing a scanning action. In this case, it is possible to shorten the length of the fracture layer 7 in the circumferential direction (FIG. 5D). Furthermore, when the bonding interface at the outer circumferential portion of the semiconductor wafer 1 is irradiated with laser light 6, in the description given above, the bonding interface is irradiated with laser light 6 from the side surface of the semiconductor wafer 1 in a parallel fashion with respect to the front surface 1a of the water 1, but it is also possible to irradiate with laser light 6 focused from the outer circumference edge section of the bonding interface towards the inner side of the outer circumference edge section, by irradiating with laser light from a direction perpendicular to the wafer surface. The direction of irradiation may be from the semiconductor wafer side, or from the supporting substrate side, provided that the functions of the device are not impaired.

The laser irradiation method is described below. When the energy hoof a photon is smaller than the absorption band gap $E_G$ of a material, then the material is optically transparent. Therefore, the condition where absorption occurs in the material is $h\nu > E_G$. However, with an optically transparent material, if the strength of the laser light is extremely high, then absorption occurs in the material under the condition $nh\nu > E_G$ (n=2, 3, 4, . . . ). This phenomenon is called "multi-photon absorption". In the case of a pulse wave, the intensity of the laser light is determined by the peak power density ($W/cm^2$) of the condensation point of the laser light. In general, multi-photon absorption occurs when the peak power density is equal to or greater than $1 \times 10^8$ ($W/cm^2$). The peak power density is determined by dividing (energy per pulse of laser light at the condensation point) by product of (cross-sectional area of laser light beam spot×pulse width). Furthermore, in the case of continuous wave, the intensity of the laser light is determined by the field intensity ($W/cm^2$) of the condensation point of the laser light. In the case of the bonding interface according to the present invention, the peak power density whereby a good fracture layer is formed is between $1 \times 10^{10}$ $W/cm^2$ and $1 \times 10^{12}$ $W/cm^2$. The condensation point means the point where the light is actually condensed by lenses, etc. At the point where the light is condensed to the greatest extent by the optical system used, the condensation point and the focal point coincide with each other.

In the fracture layer forming step according to embodiments of the present invention, a fracture layer 7 is formed by irradiating the bonding interface with laser light having the condensation point placed on the bonding interface, under conditions where multi-photon absorption occurs. In embodiments of the present invention, the semiconductor wafer does not generate heat and form a fracture layer due to the semiconductor wafer absorbing laser light, but rather the laser light is transmitted through the semiconductor wafer, gives rise to multi-photon absorption in the bonding interface, and forms a fracture layer therein. Since the laser light is not absorbed in the semiconductor wafer, the surface of the semiconductor wafer does not melt.

In embodiments of the present invention, the fracture layer is a layer where the coupled state created by the silane coupling agent is eliminated, and the fracture layer is generated in the bonding interface between the semiconductor wafer and the supporting substrate which have been coupled by the silane coupling agent. More specifically, the Si—O—Si coupling which has absorbed a $CO_2$ laser, or the like, is disassociated, and the coupling between the wafer and the supporting substrate is eliminated. The multi-photon absorption at the condensation point of the laser light arises readily in the bonding interface which includes the silane coupling agent, and therefore the fracture layer can be formed readily. In other words, in the bonding interface, the coupling is disassociated at lower energy and the fracture layer is formed more readily, than in glass or silicon. Furthermore, since the coupling between the semiconductor wafer and the supporting substrate is performed via the silane coupling agent, then it is considered that this coupling is clearly weaker than the coupling of the actual bulk elements such as the silicon wafer or glass, etc.

In the fracture layer forming step according to an aspect of the present invention, the laser light and laser light irradiation conditions can be set as follows, for example.
(A) Laser light
  Light source: $CO_2$ laser
  Wavelength: 10.6 μm
  Cross-sectional area of laser light spot: $3.14 \times 10^{-8}$ cm$^2$
  Vibration mode: Q switch pulse
  Repetition frequency: 100 kHz
  Pulse width: 30 ns
  Output: Output<1 mJ/pulse
  Laser light quality: $TEM_{00}$
  Polarization characteristics: Linear polarization
(B) Condensing Lens
  Transmissivity at laser light wavelength: 60%
(C) Rate of movement of stand holding semiconductor wafer bonded with supporting substrate: 100 mm/sec
  Peak power density: $1 \times 10^{12}$ W/cm$^2$ The laser light source is not limited to a $CO_2$ laser, provided that the wavelength is in wavelength region which is transmitted by the supporting substrate and the semiconductor wafer. More specifically, in the case of an Si wafer, the wafer absorbs light provided that the light is not in the infrared region (absorbs wavelengths equal or lower than near infrared light), and therefore the $CO_2$ laser is appropriate. Furthermore, with a substrate which has a broad band gap, such as a SiC wafer, the wafer also transmits visible light, and therefore laser light having a wavelength equal to or longer than 355 nm can be used. For instance, possible examples of the laser light source are the third harmonics, the second harmonics and the fundamental wave of Nd:YAG and YLF laser.

The laser light quality of $TEM_{00}$ means that the light has a high degree of condensation, and can be condensed up to the level of the wavelength of the laser light.

When the supporting substrate 3a is separated from the semiconductor wafer 1, a part of the outer circumference portion of the semiconductor wafer 1 is taken up, and firstly, the fracture layer 7 provided in the outer circumferential portion of the semiconductor wafer is separated to create a trigger point for separation, whereupon the semiconductor wafer 1 is gradually and progressively pulled up until the whole of the semiconductor wafer 1 is lifted up and separated (FIG. 4C and FIG. 5B). Furthermore, this lifting up operation can be divided into a plurality of stages. Provided that the lifting angle is restricted, then even if the semiconductor wafer 1 being lifted up has a small thickness, it is still possible to separate the joined supporting substrate 3a as a result of the wafer bending upwards to an extent that avoids cracking thereof. By these steps, it is possible to fabricate the front surface 1a of the semiconductor wafer 1.

FIG. 6A through 6C are cross-sectional diagrams showing a front surface bonding step, in the method for manufacturing according to embodiments of the present invention. A front surface side functional structure 5 is formed on the front surface 1a of the semiconductor wafer 1 (FIG. 6A). A silane coupling agent 2 is applied to the outer circumference of the front surface 1a of the semiconductor wafer 1 where the front surface functional structure 5 is not formed, for example, to the whole of the portion up to approximately 3 mm to the inside from the outer circumference edge section of the semiconductor wafer, in such a manner that the silane coupling agent does not adhere to the front surface side functional structure 5 (FIG. 6A). Thereupon, a silane coupling agent 2 is applied to the whole of the surface of the ring-shaped supporting substrate 3b so as not to cover the front surface side functional structure 5 (FIG. 6B), and the semiconductor wafer 1 and the supporting substrate 3b are joined together (FIG. 6C). Thereupon, the supporting substrate 3b can be bonded to the semiconductor wafer 1 by causing the silane coupling agent to react by heating for 10 minutes to 6 hours at 90° C. to 200° C., for example. Provided that the supporting substrate 3b can be bonded to the semiconductor wafer 1, it is also possible to join the semiconductor wafer 1 and the supporting substrate 3b by applying the silane coupling agent 2 to only a part of the outer circumference portion of the front surface 1a of the semiconductor wafer 1.

Figure 7:
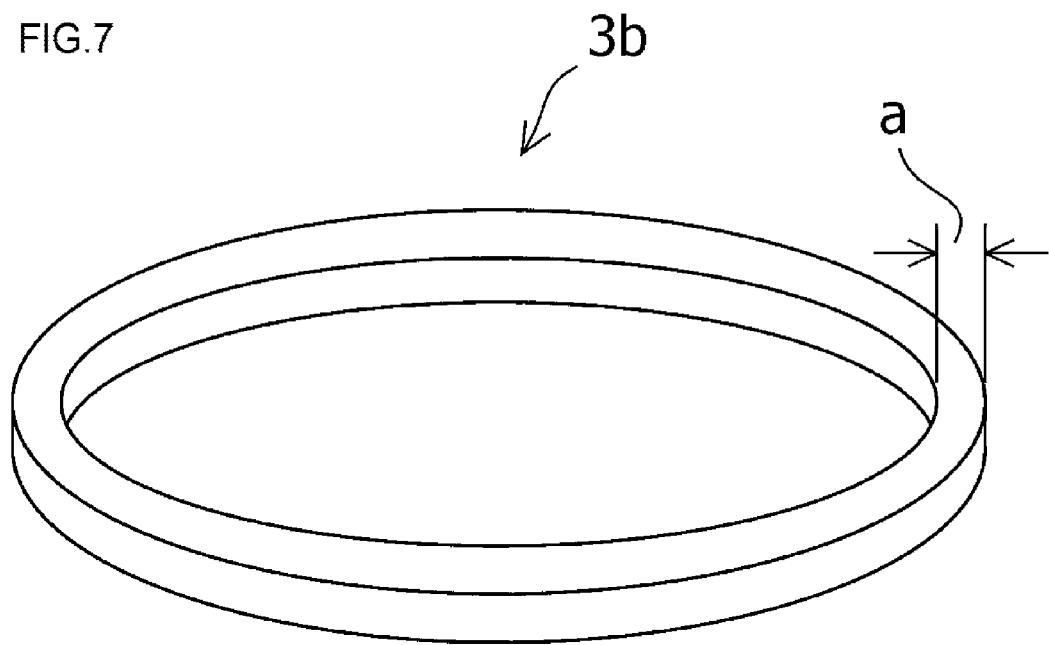
FIG. 7 is an oblique diagram of a supporting substrate 3b.

FIG. 7 is an oblique diagram of the supporting substrate 3b. The outer diameter of the supporting substrate 3b is the same as the outer diameter of the semiconductor wafer 1; for example, it is desirable to use a supporting substrate 3b having an outer diameter of 6 inches for a semiconductor wafer 1 having an outer diameter of 6 inches. The surface which is bonded with the semiconductor wafer 1 and the surface on the opposite side to this surface are flat and the width a can be set to approximately 2 mm to 5 mm.

FIG. 8 is a plan diagram showing the front surface 1a of the semiconductor wafer 1 after the functional structure forming step. The front surface 1a of the semiconductor wafer 1 can be divided into a functional structure forming region 1c which is the region where the functional structure is formed, and an outer circumference region 1d where the functional structure is not formed. The front surface side functional structure 5 is formed on the functional structure forming region 1c. Desirably, the width a of the supporting substrate 3b is substantially the same as the width b of the outer circumference region.

Figure 9A:
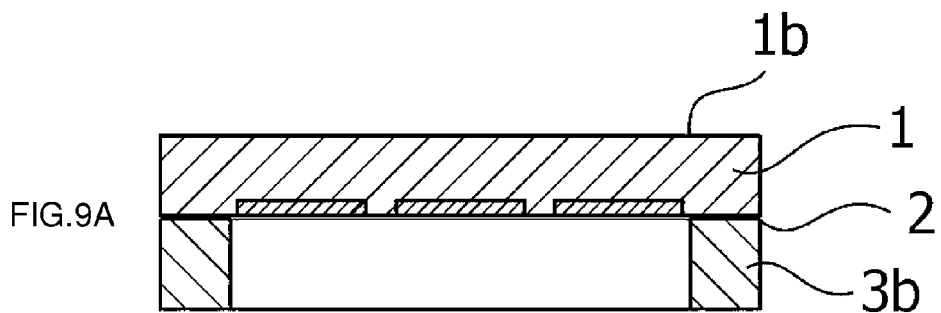
FIGS. 9A through 9C are cross-sectional diagrams showing a fracture layer forming step on the front surface side, a fracture layer separating step on the front surface side, and a bonding interface separating step on the front surface side.
Figure 9B:
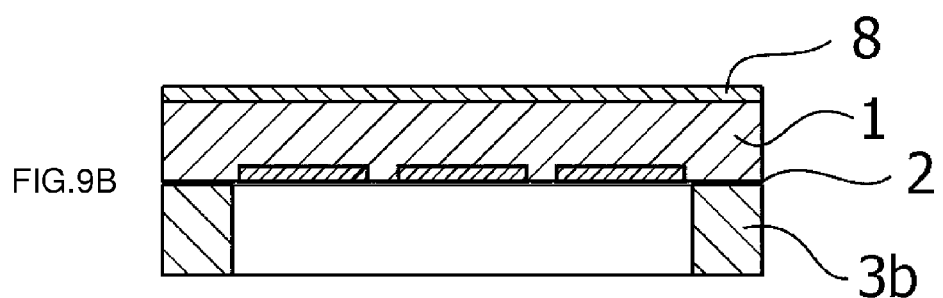
Figure 9C:
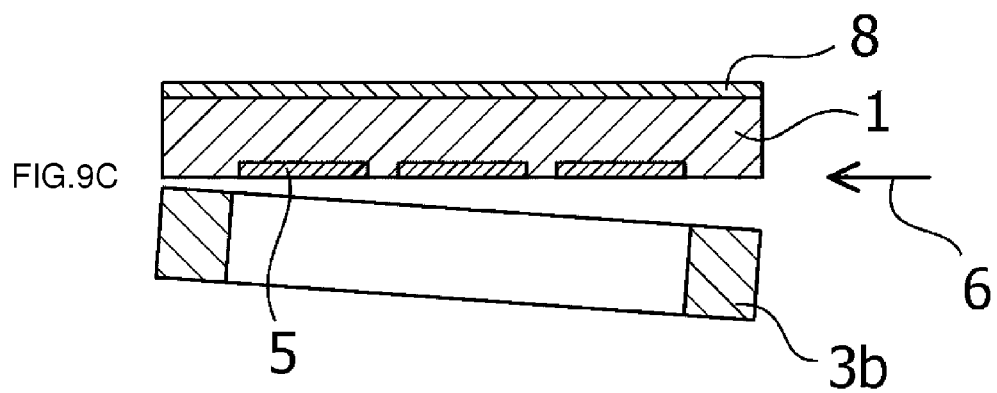

FIGS. 9A through 9C are cross-sectional diagrams showing a fracture layer forming step on the front surface side, a fracture layer separating step on the front surface side, and a bonding interface separating step on the front surface side. The front surface side functional structure 5 is fabricated on the front surface 1a of the semiconductor wafer 1 by the steps in FIGS. 4A through 4C, whereupon the semiconductor wafer 1 to which the supporting substrate 3b has been bonded by the steps in FIGS. 6A through 6C (FIG. 9A) is subjected to steps including ion injection, heat treatment and electrode formation, and the like, to form the rear surface device structure 8 (FIG. 9B). After forming the rear surface device structure 8, as illustrated in FIGS. 4A through 5D, the fracture layer is formed by irradiating the bonding interface with laser light, and the supporting substrate 3b is separated from the semiconductor wafer 1 (FIG. 9C). By these steps, it is possible to fabricate the rear surface 1b of the semiconductor wafer 1.

FIGS. 10A and 10B are cross-sectional diagrams of a semiconductor wafer and a supporting substrate when voids are present in the bonding interface between the semiconductor wafer and the supporting substrate, and FIG. 10C is an ultrasonic image of same. A supporting substrate 3c having the same diameter as the semiconductor wafer 1 is prepared (FIG. 10A). Here, the supporting substrate 3c has voids 9 in portions of the bonding surface with the semiconductor wafer 1. The voids 9 can be formed by irradiating the front surface of the supporting substrate 3c, either entirely or partially, with argon plasma, or the like, before bonding the supporting substrate 3c to the semiconductor wafer 1. By irradiating the surface of the substrate with argon plasma, the supporting substrate material is sputtered by the argon ions and very fine projections and recesses are formed in the surface of the supporting substrate. Consequently, locations are formed where the silane coupling agent does not enter into the fine projections and recesses and coupling does not occur, and therefore a void is formed. The fine undulations may be smaller than the size of the molecules of the silane coupling agent, and desirably have a size from 10 nm to 10 μm. The argon plasma may be a plasma of inert gas, such as neon or krypton, or may be a hydrogen plasma or a nitrogen plasma. Moreover, in general, a device which is used in dry etching is employed. Desirably, particular ions are accelerated in a particular direction, as in ion beam sputtering, so as to etch the surface of the supporting substrate. However, the method is not limited to that described above, provided that fine undulations can be formed in the supporting substrate and the semiconductor wafer. Moreover, there are also cases where voids occur spontaneously. In any case, voids occur when the silane coupling agent is not formed uniformly on the bonding surface of the supporting substrate or semiconductor wafer, and there are local insufficiencies in the silane coupling agent. When the supporting substrate 3a is bonded with the semiconductor wafer 1, the voids 9 are present in the bonding interface (FIG. 10B). Due to the presence of gaps, such as voids, which are unbonded portions, in the bonding interface, the bonding interface can be separated easily in the bonding interface separating step. FIG. 10C is an ultrasonic image of the bonding interface between the semiconductor wafer and the supporting substrate. This image was captured from the front surface direction of the semiconductor wafer 1, and it can be seen that voids are distributed in the form of white specks on the bonding interface. Desirably, the size of the voids is 5 μm to 5 mm, and the depth of the voids is no more than 100 nm.

Figure 11A:
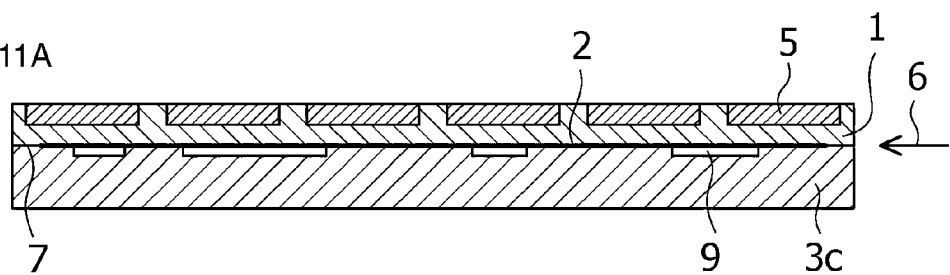
FIGS. 11A through 11D are cross-sectional diagrams showing one embodiment of the fracture layer separating step and a bonding interface separating step according to embodiments of the present invention.
Figure 11B:
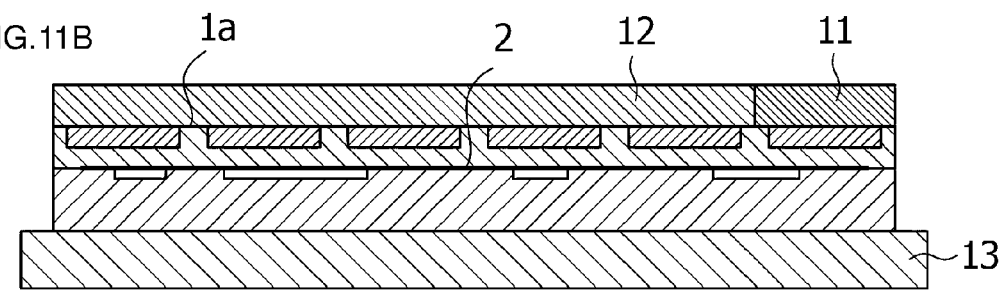
Figure 11C:
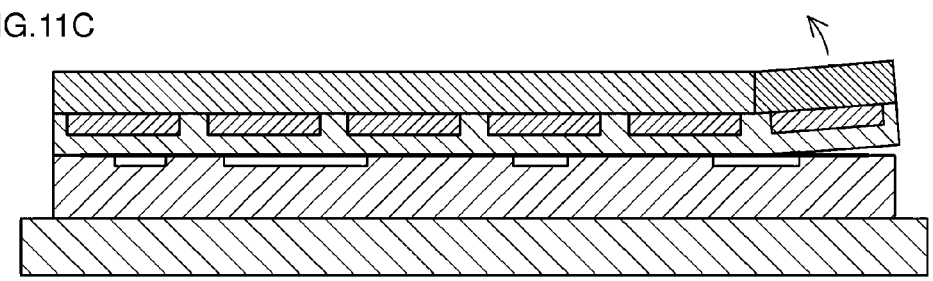
Figure 11D:
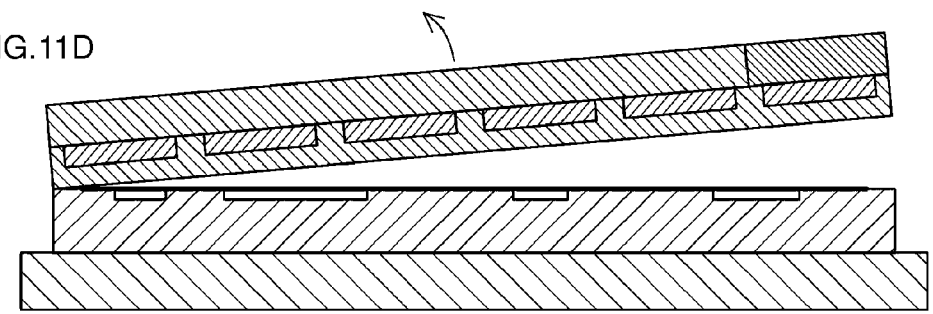

FIGS. 11A through 11D are cross-sectional diagrams showing one embodiment of the fracture layer separating step and a bonding interface separating step according to an aspect of the present invention. An example is shown here in which a semiconductor wafer 1 on the front surface side of which the functional structure 5 has been formed is bonded with a supporting substrate 3c, and voids 9 are present (FIG. 11A). The bonding interface is irradiated with laser light 6 from the side surface of the semiconductor wafer 1, and as illustrated in FIG. 5C, a fracture layer 7 is formed about the whole circumference of the bonding interface (FIG. 11A). Next, the front surface 1a of the semiconductor wafer 1 on which the front surface side functional structure 5 has been formed is fixed by a suction device 11 and a suction device 12. The rear surface of the supporting substrate 3c is fixed by vacuum chuck or electrostatic chuck on a wafer fixing stage 13 (FIG. 11B). The fracture layer and the bonding interface are separated using the suction device or wafer fixing stage. The suction device 11 is a suction device for creating a trigger for separation of the fracture layer 7, and fixes the outer circumference edge section of the front surface 1a of the semiconductor wafer 1. Furthermore, the suction device 12 is a suction device for separating the bonding interface and the fracture layer 7 which has not been separated by the suction device 11, and the suction device 12 fixes a part of the front surface 1a of the semiconductor wafer 1 which is not fixed by the suction device 11. The wafer fixing stage 13 fixes the rear surface of the supporting substrate 3c in such a manner that the supporting substrate 3c does not move, so as to assist the separation performed by the suction device 11 and the suction device 12. The suction surface of the suction device 11 and the suction surface of the suction device 12 are configured so as to be movable simultaneously in a coplanar state, or in such a manner that the suction device 11 can be moved alone, independently of the suction device 12. In order to separate the fracture layer 7, the suction device 11 is lifted up in a direction (the direction of the arrow in FIG. 11C) of lifting the edge section of the semiconductor wafer 1, with the suction device 12 in a stationary state (FIG. 11B). The fracture layer 7 in the edge section of the bonding interface between the semiconductor wafer 1 and the supporting substrate 3c (the outer circumferential portion of the respective wafers) is separated and creates a trigger (separating section) for separating the whole of the bonding interface (FIG. 11C). The direction in which the edge portion of the semiconductor wafer 1 is lifted up is inclined so as to form a slight angle with respect to the perpendicular direction of the suction surfaces of the suction devices 11, 12. More specifically, the inclination is desirably 1° to 10°. When the inclination to the inside is large, a trigger for separation is created readily in the edge section of the bonding interface, but a large stress is applied in the vicinity of the boundary between the suction device 11 and the suction device 12. Therefore, the outer circumference of the semiconductor wafer 1 should be lifted up by inclining the semiconductor wafer 1 to an extent which avoids fracturing thereof. Subsequently, the suction surface of the suction device 11 is returned to a coplanar state with the suction surface of the suction device 12, whereupon, while keeping the suction surfaces of the suction devices 11, 12 in a coplanar state, the wafer is lifted up in a separating direction (the direction of the arrow in FIG. 11D), continuously, from the separating section formed previously by the suction device 11. When the suction surfaces of the suction devices 11 and 12 are inclined gradually, the whole of the bonding interface is separated (FIG. 11D). By pulling the suction device 11 and the suction device 12 in stages, cracks occur along the bonding interface, starting from the separation of the fracture layer 7, whereby separation along the bonding interface can be achieved. In this example, there are voids 9 in the bonding interface, and bonding by the silane coupling agent is not performed in the portion of the voids 9, thus making separation easy to perform. Here, in cases where, as shown in FIG. 5D, only a part of the wafer is irradiated with laser light, the portion which is suctioned by the suction device 11 should be a location that has been irradiated with laser light. As shown in FIGS. 12A through 12D, the separation device provided with the suction devices 11 and 12 is not restricted to use in cases where voids 9 are present in the bonding interface. For example, the device can also be applied to semiconductor substrates in which a semiconductor wafer and a supporting substrate are bonded without providing voids 9, and which are irradiated with laser light as shown in FIGS. 5C and 5D. The term "coplanar" used above means that the position where the suction device 11 starts separation is at the same height as the suction device 12 (the suction surface which suctions the front surface side functional structure 5).

FIGS. 12A through 12D are cross-sectional diagrams showing one embodiment of a fracture layer separating step and a bonding interface separating step according to an aspect of the present invention which are different to those in FIGS. 11A through 11D. An example is shown here in which a semiconductor wafer 1 on the front surface side of which the functional structure 5 has been formed is bonded with a supporting substrate 3c, and voids 9 are present (FIG. 12A). A support material 15 is joined by adhesive 14 to the front surface 1a of the semiconductor wafer 1 (FIG. 12A). The support material 15 may be Si, SiC, glass, or the like. The bonding interface is irradiated with laser light 6 from the side surface or the rear surface of the supporting substrate 3c, and a fracture layer 7 is formed is about the whole circumference of the bonding interface (FIG. 12B). Thereupon, the rear surface of the support material 15 and the rear surface of the supporting substrate 3c are fixed by being respectively held by vacuum chuck or electrostatic chuck, on the wafer fixing stages 16, 13 (FIG. 12C). By subsequently pulling the wafer fixing stage 16 in direction inclined at slight angle of approximately 5°, for instance, from the perpendicular direction to the suction surface (the direction of the arrow in FIG. 12D), the semiconductor wafer 1 is lifted up from the edge section, and the edge section of the bonding interface and the fracture layer 7 in this edge section are separated, thus creating a trigger for separation of the whole bonding interface (FIG. 12D). Thereupon, by further lifting up the wafer fixing stage 16 by pulling in the direction of the arrow in FIG. 12D, the whole of the bonding surface is separated (FIG. 12D). The configuration shown in FIGS. 12A through 12D is not limited to use in cases where voids 9 are present in the bonding interface. For example, the device can also be applied to semiconductor substrates in which a semiconductor wafer and a supporting substrate are bonded without providing voids 9, and which are irradiated with laser light as shown in FIGS. 5C and 5D.

By the method illustrated in FIGS. 3A through 12D above, it is possible to manufacture a semiconductor device. In FIGS. 5A through 5D and FIGS. 10A through 12D, an example of the bonding between the rear surface 1b of a semiconductor wafer 1 and a supporting substrate 3a, 3c was described, but a similar description could also be applied to a case where a supporting substrate 3b is bonded to the front surface 1a of the semiconductor wafer 1. According to the method illustrated in FIGS. 3A through 12D, even if a high-temperature process using a diffusion temperature of approximately 1000° C. is involved when forming a front surface side functional structure 5 or a rear surface side device structure 8, it is possible to manufacture a semiconductor device without any problems.

PRACTICAL EXAMPLES

Below, the embodiments of the present invention were described on the basis of practical examples and comparative examples, but the present invention is not limited to the practical examples and comparative examples.
(Bonding of Supporting Substrate)

Practical Example 1

An Si wafer having a thickness of 500 μm and a diameter of 6 inches was taken as the semiconductor wafer, and a silane coupling agent was applied to a rear surface of this semiconductor wafer, and to the front surface of a supporting substrate (made from high-thermal-resistance glass, outer diameter 6 inches, width 3 mm, thickness 300 μm), using a mask and a squeegee. The squeegee is an application tool made from synthetic rubber. For the silane coupling agent, 3-glycidoxy propyl trimethoxy silane ("KBM-403" made by Shin-Etsu Silicone Co., Ltd.), which is an epoxy silane, was used. The silane coupling agent was used by diluting in pure water to achieve a concentration of 0.1 wt % of the 3-glycidoxy propyl trimethoxy silane. Thereupon, the rear surface of the semiconductor wafer and the supporting substrate are joined together and bonded. After application and joining, the wafer was left for 10 minutes, and was cured by heating for two hours at 140° C.

Practical Example 2

Apart from using, as a silane coupling agent, 3-triethoxy silyl-N-(1,3-dimethyl-butylidene) propyl amine ("KBE-9103" made by Shin-Etsu Silicone Co., Ltd.), which is an amine-type silane, instead of epoxy silane, a supporting substrate was joined to the rear surface of the semiconductor wafer by a similar method to practical example
(Thermal Resistance Test)

The semiconductor wafer to which the supporting substrate according to practical example 1 and practical example 2 had been bonded was subjected to a thermal resistance test and a heat cycle test so as to confirm the possibility of application to a high-temperature process at 1000° C. The thermal resistance test was carried out under conditions wherein the semiconductor wafer according to practical example 1 and practical example 2 was exposed to a temperature of 1100° C. for two hours, and the bonding properties of the silane coupling agent, and the presence or absence of abnormalities in the semiconductor wafer, were then evaluated. As a result of this, no abnormalities were observed in the bonding properties of the silane coupling agent, or in the semiconductor wafer, in either of the semiconductor wafers according to practical example 1 and practical example 2.

According to the embodiments of the present invention described above, it is possible to provide a method for bonding a supporting substrate to a semiconductor wafer, and a method for manufacturing a semiconductor device, which can be applied to a high-temperature process at around 1000° C.

Reference signs and numerals are as follows:
1 semiconductor wafer
1a front surface of semiconductor wafer
1b rear surface of semiconductor wafer
1c functional structure forming region
2 silane coupling agent
3a, 3b, 3c supporting substrate
5 front surface side functional structure
6 laser light
7 fracture layer
8 rear surface device structure
9 void
11, 12 suction device
13, 16 wafer fixing stage
14 adhesive
15 support material In this disclosure, since only a few embodiments have been shown and described, the usage of the term "step" or "steps" does not limit the manufacturing methods to a particular recited sequence of the step or steps. The necessity of a particular sequence for discussed steps is instead determined based on the principles and spirit of the invention, the scope of which is defined in the claims and their equivalents.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. A method for manufacturing a semiconductor device, comprising:
    bonding a part of a rear surface of a semiconductor wafer and a supporting substrate to each other using a silane coupling agent, thereby forming a bonding interface between the semiconductor wafer and the supporting substrate;
    forming a functional structure on a front surface of the semiconductor wafer;
    forming a fracture layer on a part of an outer circumferential section of the bonding interface by irradiating the bonding interface with a laser light having a condensation point positioned on the bonding interface;
    separating the fracture layer;
    separating the semiconductor wafer and the supporting substrate from each other along the bonding interface; and
    carrying out rear surface processing on the rear surface of the semiconductor wafer.

2. The method for manufacturing a semiconductor device according to claim 1, further comprising:
    bonding a ring-shaped supporting substrate to an outer circumference region of the front surface of the semiconductor wafer, where the functional structure is not formed, before the carrying out rear surface processing.

3. The method for manufacturing a semiconductor device according to claim 2, wherein the bonding of the ring-shaped supporting substrate is performed using a silane coupling agent.

4. The method for manufacturing a semiconductor device according to claim 3, wherein voids are present in the bonding interface between the semiconductor wafer and the supporting substrate.

5. The method for manufacturing a semiconductor device according to claim 4, wherein the irradiating the bonding interface is performed by irradiating with the laser light in a direction perpendicular to the bonding interface.

6. The method for manufacturing a semiconductor device according to claim 4, wherein the irradiating the bonding interface is performing by irradiating with the laser light from a position lateral to a side surface of the semiconductor wafer to which the supporting substrate has been bonded.

7. The method for manufacturing a semiconductor device according to claim 6, wherein the semiconductor wafer is a wafer selected from a Si wafer, a SiC wafer and a GaN wafer.

8. The method for manufacturing a semiconductor device according to claim 7, wherein the supporting substrate is any substrate selected from a high-thermal-resistance glass, a Si wafer, a Si wafer having a $SiO_2$ layer on a surface thereof, and a SiC wafer.

9. The method for manufacturing a semiconductor device according to claim 8, wherein the silane coupling agent is at least one silane selected from a vinyl silane, epoxy silane, styryl silane, methacrylic silane, acryl silane, amino silane, ureide silane, mercapto silane, sulfide silane, and isocyanate silane.

10. The method for manufacturing a semiconductor device according to claim 9, wherein a thickness of the semiconductor wafer before the carrying out rear surface processing is less than 300 μm when a wafer diameter is 6 inches, and is less than 400 μm when a wafer diameter is 8 inches.

11. The method for manufacturing a semiconductor device according to claim 1, wherein voids are present in the bonding interface between the semiconductor wafer and the supporting substrate.

12. The method for manufacturing a semiconductor device according to claim 1, wherein the irradiating the bonding interface is performing by irradiating with the laser light from a position lateral to a side surface of the semiconductor wafer to which the supporting substrate has been bonded.

13. The method for manufacturing a semiconductor device according to claim 1, wherein the irradiating the bonding interface is performed by irradiating with the laser light in a direction perpendicular to the bonding interface.

14. The method for manufacturing a semiconductor device according to claim 1, wherein the semiconductor wafer is a wafer selected from a Si wafer, a SiC wafer and a GaN wafer.

15. The method for manufacturing a semiconductor device according to claim 1, wherein the supporting substrate is any substrate selected from a high-thermal-resistance glass, a Si wafer, a Si wafer having a $SiO_2$ layer on a surface thereof, and a SiC wafer.

16. The method for manufacturing a semiconductor device according to claim 1, wherein the silane coupling agent is at least one silane selected from a vinyl silane, epoxy silane, styryl silane, methacrylic silane, acryl silane, amino silane, ureide silane, mercapto silane, sulfide silane, and isocyanate silane.

17. The method for manufacturing a semiconductor device according to claim 1, wherein a thickness of the semiconductor wafer before the carrying out rear surface processing is less than 300 μm when a wafer diameter is 6 inches, and is less than 400 μm when a wafer diameter is 8 inches.

18. The method for manufacturing a semiconductor device according to claim 1, wherein in the forming the fracture layer, the fracture layer formed is weaker in mechanical strength than the semiconductor wafer.

19. The method for manufacturing a semiconductor device according to claim 18, wherein the separating the fracture layer the interface is performed by pulling a portion of the semiconductor wafer on the fracture layer and a portion of the supporting substrate on the fracture layer away from each other to cause the fracture layer to fracture.

* * * * *